(12) United States Patent
Lin et al.

(10) Patent No.: US 11,670,708 B2
(45) Date of Patent: Jun. 6, 2023

(54) SEMICONDUCTOR DEVICE

(71) Applicant: Vanguard International Semiconductor Corporation, Hsinchu (TW)

(72) Inventors: Shin-Cheng Lin, Tainan (TW); Chih-Yen Chen, Tainan (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 284 days.

(21) Appl. No.: 17/032,977

(22) Filed: Sep. 25, 2020

(65) Prior Publication Data

US 2022/0102541 A1 Mar. 31, 2022
US 2022/0102541 A1 Mar. 31, 2022

(51) Int. Cl.
*H01L 29/778* (2006.01)
*H01L 29/10* (2006.01)

(52) U.S. Cl.
CPC ...... *H01L 29/7786* (2013.01); *H01L 29/1025* (2013.01)

(58) Field of Classification Search
CPC ..... H01L 29/402–407; H01L 29/66431; H01L 29/66462; H01L 29/778–7789
See application file for complete search history.

(56) References Cited

U.S. PATENT DOCUMENTS

| | | | | |
|---|---|---|---|---|
| 2012/0126287 A1* | 5/2012 | Aoki | ........... | H01L 29/7787 257/192 |
| 2013/0334573 A1* | 12/2013 | Ostermaier | ....... | H01L 21/30604 257/E21.403 |
| 2014/0319532 A1* | 10/2014 | Werner | ............. | H01L 29/66431 438/191 |
| 2016/0322222 A1* | 11/2016 | Cheng | ............... | H01L 21/02463 |
| 2019/0006501 A1* | 1/2019 | Yang | .................. | H01L 29/7783 |
| 2019/0103468 A1* | 4/2019 | Lin | ..................... | H01L 29/205 |

* cited by examiner

*Primary Examiner* — Eric A. Ward
(74) *Attorney, Agent, or Firm* — Birch, Stewart, Kolasch & Birch, LLP

(57) ABSTRACT

A semiconductor device is provided, including a substrate, a seed layer on the substrate, an epitaxial layer on the seed layer, an electrode structure on the epitaxial layer and an electric field modulation structure. The electrode structure includes a gate structure, a source structure and a drain structure, wherein the source structure and the drain structure are positioned on opposite sides of the gate structure. The electric field modulation structure includes an electric connection structure and a conductive layer electrically connected to the electric connection structure. The conductive layer is positioned between the gate structure and the drain structure. The electric connection structure is electrically connected to the source structure and the drain structure.

19 Claims, 21 Drawing Sheets

SEMICONDUCTOR DEVICE

BACKGROUND

Technical Field

The disclosure relates to semiconductor technology, and more particularly to an electric field modulation structure.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) devices and high-frequency devices, such as high electron mobility transistors (HEMT) with heterogeneous interfacial structures.

Even though current high electron mobility transistors may be adequate for their intended purposes, they have not been entirely satisfactory in every respect. For example, in the current devices, the gate structure is easily affected by the high electric field, impacting the reliability of the device. Therefore, the industry still aims at improving performance and reliability of high electron mobility transistor devices.

SUMMARY

Some embodiments of the present disclosure provide a semiconductor device. The semiconductor device includes a substrate, a seed layer on the substrate, an epitaxial layer on the seed layer, an electrode structure on the epitaxial layer and an electric field modulation structure. The electrode structure includes a gate structure, a source structure and a drain structure, wherein the source structure and the drain structure are positioned on opposite sides of the gate structure. The electric field modulation structure includes an electric connection structure and a conductive layer electrically connected to the electric connection structure. The conductive layer is positioned between the gate structure and the drain structure. The electric connection structure is electrically connected to the source structure and the drain structure. A lengthwise direction of the source structure is a first direction and a direction from the source structure to the drain structure is a second direction, wherein the first direction is perpendicular to the second direction.

A detailed description is given in the following embodiments with reference to the accompanying drawings.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
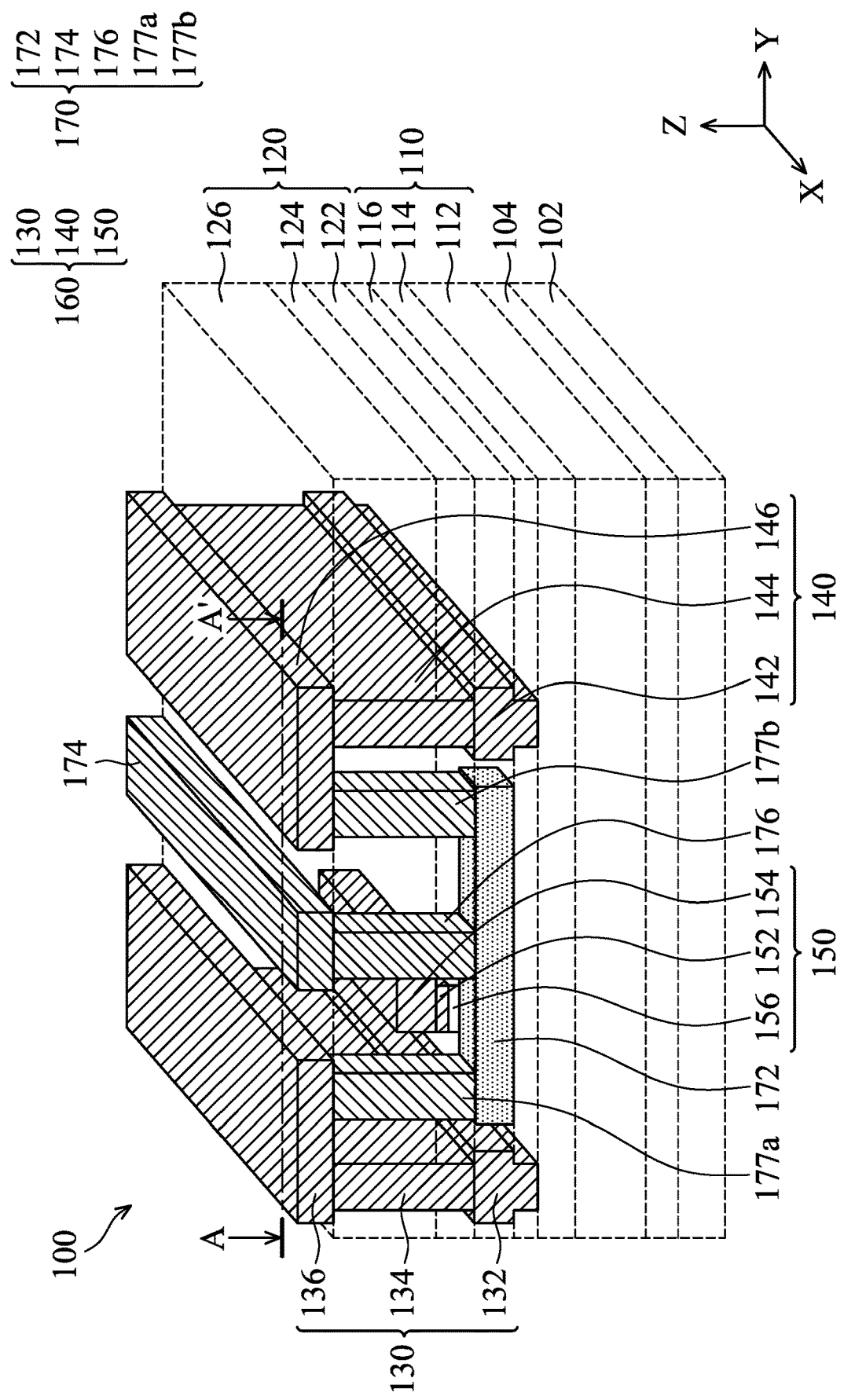
FIG. 1 is a partial perspective view illustrating an exemplary semiconductor device according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Unless otherwise defined, all terms used herein (including technical and scientific terms) have same meanings as comprehended by those skilled in the art. It should be understood that these terms, such as generally defined by commonly used dictionaries, should be interpreted in consistent with related technology and background information of the present disclosure, and should not be interpreted in idealized or overly formal ways, unless they have specific definitions in the embodiments of the present disclosure.

The semiconductor device with the electric field modulation structure provided by the present disclosure may modify the electric field distribution, and thus reduce the risk of the gate structure suffering from high electric fields. In addition, when the switch is off, the conductive path may be formed by the electric field modulation structure to guide the carriers (such as electrical charges) outside the device, thereby improving the performance of the semiconductor device. In addition, the semiconductor device provided by the present disclosure is particularly suitable for high electron mobility transistors (HEMT).

First, referring to FIG. 1, FIG. 1 is a partial perspective view illustrating an exemplary semiconductor device 100 according to some embodiments of the present disclosure. As shown in FIG. 1, the semiconductor device 100 includes a substrate 102, a seed layer 104 on the substrate 102, an epitaxial layer 110 on the seed layer 104, a dielectric layer 120 on the epitaxial layer 110, and an electrode structure 160 and an electric field modulation structure 170 in the dielectric layer 120. It should be noted that in order to highlight the technical features of the electrode structure 160 and the electric field modulation structure 170, the films therebetween or therebelow are shown in "dash line" in FIG. 1 and the following perspective views. In addition, it should be also noted that although those technical features are shown in "dash line", they still belongs to a portion of the semiconductor device of the present disclosure.

Still referring to FIG. 1, a substrate 102 is provided. In some embodiments, the substrate 102 may be silicon on insulator (SOI). In some embodiments, the substrate 102 may include a ceramic base substrate and a pair of blocking layers sandwiching the ceramic base substrate (not shown).

In some embodiments, the ceramic base substrate includes a ceramic material. The ceramic material includes a metal inorganic material. In some embodiments, the ceramic base substrate may include silicon carbide (SiC), aluminum nitride (AlN), sapphire, or another suitable material. The aforementioned sapphire base may include aluminum oxide.

In some embodiments, the blocking layers on the upper and lower surface of the ceramic base substrate may include one or more layers of insulating material and/or another suitable material (such as a semiconductor layer). The insulating material layer may include an oxide, a nitride, an oxynitride, or another suitable material. The semiconductor layer may include polycrystalline silicon. The blocking layers may prevent the ceramic base substrate from diffusion and may block the ceramic base substrate from interaction with other layers or process tools. In some embodiments, the blocking layer encapsulates the ceramic base material 102C (not shown). In such case, the blocking layers not only cover the upper and lower surface of the ceramic base substrate, but also cover side surfaces of the ceramic base substrate.

Next, still referring to FIG. 1, a seed layer 104 is formed on the substrate 102. In some embodiments, the seed layer 104 is made of silicon (Si), aluminum nitride (AlN) or another suitable material. In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly attaching seed crystals, or another suitable process. The CVD process may include a vapor-phase epitaxy (VPE) process, a low pressure CVD (LPCVD) process, an ultra-high vacuum CVD (UHV-CVD) process, or another suitable process.

Next, still referring to FIG. 1, an epitaxial layer 110 is formed on the seed layer 104. In some embodiments, the epitaxial layer 110 includes a buffer layer 112 on the seed layer 104, a channel layer 114 on the buffer layer 112, and a barrier layer 116 on the channel layer 114.

In some embodiments, the buffer layer 112 is formed on the seed layer 104 using an epitaxial growth process. Formation of the buffer layer 112 may be helpful to mitigate the strain on the channel layer 114 that is subsequently formed on the buffer layer 112, and to prevent defects in the overlying channel layer 114. In some embodiments, the buffer layer 112 includes AlN, GaN, $Al_xGa_{1-x}N$ (wherein 0<x<1), a combination thereof, or the like. The buffer layer 112 may be formed using a process such as hydride vapor phase epitaxy (HVPE), molecular beam epitaxy (MBE), metal organic chemical vapor deposition (MOCVD), a combination thereof, other suitable methods or the like. Although the buffer layer 112 in the embodiment as shown in FIG. 1 is a single layer, the buffer layer 112 may be a multilayered structure in other embodiments.

Next, a channel layer 114 is formed on the buffer layer 112 by an epitaxial growth process. In some embodiments, the channel layer 114 includes an undoped III-V group compound semiconductor material. For example, the channel layer 114 is made of undoped GaN, but the present disclosure is not limited thereto. In some other embodiments, the channel layer 114 includes AlGaN, AlN, GaAs, GaInP, AlGaAs, InP, InAlAs, InGaAs, other suitable III-V group compound materials, or a combination thereof. In some embodiments, the channel layer 114 is formed using a molecular-beam epitaxy method (MBE), a hydride vapor phase epitaxy method (HVPE), a metalorganic chemical vapor deposition method (MOCVD), other suitable methods, or a combination thereof.

Next, a barrier layer 116 is formed on the channel layer 114 by an epitaxial growth process. In some embodiments, the barrier layer 116 includes an undoped III-V group compound semiconductor material. For example, the barrier layer 116 includes undoped $Al_xGa_{1-x}N$ (wherein 0<x<1), but the present disclosure is not limited thereto. In some other embodiments, the barrier layer 116 includes GaN, AlN, GaAs, GaInP, AlGaAs, InP, InAlAs, InGaAs, other suitable III-V group compound materials, or a combination thereof. For example, the barrier layer 116 may be formed on the channel layer 114 by using a molecular-beam epitaxy method (MBE), a metalorganic chemical vapor deposition method (MOCVD), a hydride vapor phase epitaxy method (HVPE), other suitable methods, or a combination thereof.

In some embodiments, the channel layer 114 and the barrier layer 116 include different materials from each other such that a heterojunction is formed between the channel layer 114 and the barrier layer 116. Therefore, a two-dimensional electron gas (2DEG) (not shown) which is generated by a band gap between the hetero-materials may be formed at the interface between the channel layer 114 and the barrier layer 116. In some embodiments, the semiconductor structures, such as high electron mobility transistors (HEMT), may utilize 2DEG as conductive carriers. In some embodiments, the channel layer 114 may be a GaN layer, and the barrier layer 116 formed on the channel layer 114 may be an AlGaN layer, wherein the GaN layer and the AlGaN layer may be doped, such as with an n-type or a p-type dopant, or may have no dopant therein.

Also, in some embodiments, the epitaxial layer 110 is a III-V group composite layer. However, the present disclosure is not limited thereto. Besides the buffer layer 112, the channel layer 114 and the barrier layer 116, the epitaxial layer 110 may further include other films and/or layers. In some other embodiments, a carbon-doped layer is further formed between the buffer layer 112 and the channel layer 114 to increase the breakdown voltage of the semiconductor device.

Next, still referring to FIG. 1, a dielectric layer 120 is formed on the epitaxial layer 110 and an electrode structure 160 and an electric field modulation structure 170 are formed in the dielectric layer 120. In some embodiments, the electrode structure 160 and the epitaxial layer 110 therebelow may be a high electron mobility transistor (HEMT).

In some embodiments, a first dielectric layer 122, a second dielectric layer 124, and a third dielectric layer 126 included in the dielectric layer 120 may include a single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto.

In some embodiments, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials on the epitaxial layer 110 (e.g. the barrier layer 116) to form the first dielectric layer 122, the second dielectric layer 124, and the third dielectric layer 126.

In some embodiments, the electrode structure 160 includes a source structure 140 and a drain structure 130, and a gate structure 150. The source structure 140 and the drain structure 130 are formed on opposite sides of the gate structure 150, respectively.

In some embodiments, the gate structure 150 includes a gate electrode 152, and a gate metal layer 154, wherein the gate electrode 152 is formed on the barrier layer 116 and the gate metal layer 154 is formed directly above and electrically connected to the gate electrode 152.

In some embodiments, the gate metal layer 154 serving as a gate field plate may reduce the risk of the gate electrode 152 at the side near the drain structure 140 from suffering high electric field intensity. For example, the gate metal layer 154 may completely cover the gate electrode 152 to reduce the risk of the gate electrode 152 from suffering the high electric field intensity. In addition, in some embodiments, the gate metal layer 154 extends toward the drain structure 140 and beyond the gate electrode 152 to further improve the electric field distribution.

In some embodiments, the materials of the gate electrode 152 may be conductive materials, such as metal, metal nitride, or semiconductor materials. In some embodiments, the metal may be Au, Ni, Pt, Pd, Ir, Ti, Cr, W, Al, Cu, the like, the combination thereof, or multilayers thereof. The semiconductor materials may be polycrystalline silicon or polycrystalline germanium. The conductive material may be formed on the front barrier layer 116 by chemical vapor deposition (CVD), atomic layer deposition (ALD), physical vapor deposition (PVD) (such as sputtering), resistive thermal evaporation process, electron beam evaporation process, or other suitable deposition processes, and then a patterning process is performed on the conductive material to form the gate electrode 152.

In other embodiments, an optional doped compound semiconductor layer 156 may be formed between the gate electrode 152 and the barrier layer 116.

In some embodiments, before the formation of the gate electrode 152, the doped compound semiconductor layer 156 may be formed on the barrier layer 116, and the gate electrode 152 is formed on the doped compound semiconductor layer 156 subsequently. The generation of 2DEG under the gate electrode 152 can be inhibited by the doped compound semiconductor layer 156 between the gate electrode 152 and the barrier layer 116 so as to attain a normally-off status of the semiconductor device. In some embodiments, the material of the doped compound semiconductor layer 156 may be GaN which is doped with a p-type dopant or an n-type dopant. The steps of forming the doped compound semiconductor layer 156 may include depositing a doped compound semiconductor layer (not shown) on the barrier layer 116 by using an epitaxial growth process, and performing a patterning process on the doped compound semiconductor layer to form the doped compound semiconductor layer 156 corresponding to the predetermined position where the gate electrode 152 is to be formed.

In some embodiments, the source structure 130 includes a source electrode 132, a source contact 134, and a source metal layer 136 which are electrically connected to each other. The drain structure 140 includes a drain electrode 142, a drain contact 144, and a drain metal layer 146 which are electrically connected to each other. In some embodiments, the source electrode 132 and the drain electrode 142 on opposite sides of the gate electrode 152 penetrate through the barrier layer 116 and contact the channel layer 114.

The material and the formation of the source electrode 132 and the drain electrode 142 which are formed on opposite sides of the gate electrode 152 may be substantially the same as the material and the formation of the gate electrode 152. The details are not described again herein to avoid repetition.

In some embodiments, the gate metal layer 154, the source contact 134, the source metal layer 136, the drain contact 144, and the drain metal layer 146 may be formed by a deposition process and a patterning process. The material of the gate metal layer 154, the source contact 134, the source metal layer 136, the drain contact 144, and the drain metal layer 146 may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

Figure 2:
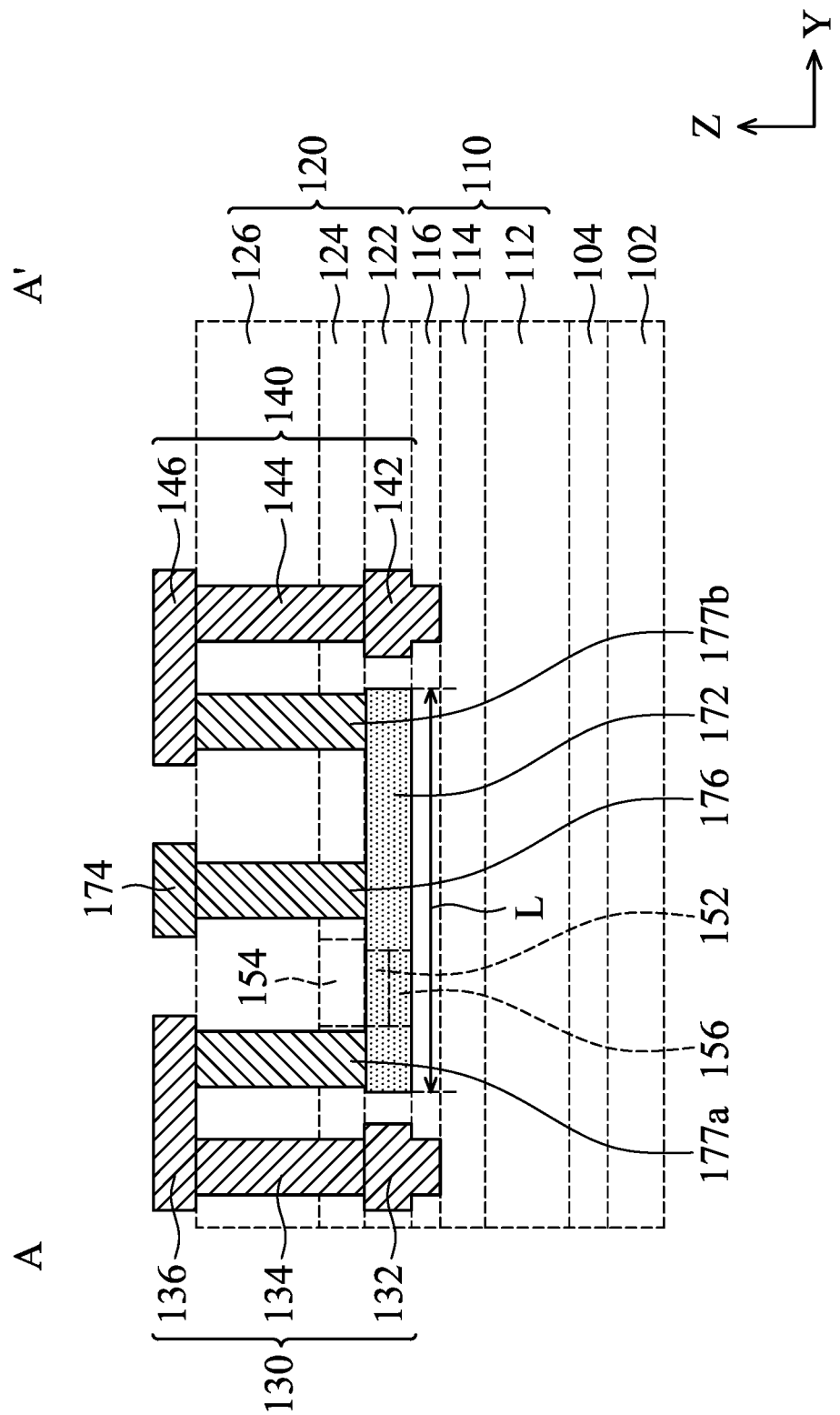
FIG. 2 is a cross-sectional view illustrating a semiconductor device along line A-A' shown in FIG. 1 according to some embodiments of the present disclosure.

Now referring to FIG. 2, in some embodiments, the gate electrode 152 is formed in the first dielectric layer 122 and the gate metal layer 154 is formed on the first dielectric layer 122 and embedded in the second dielectric layer 124. Also, the source contact 134 and the drain contact 144 on opposite sides of the gate electrode 152 penetrate through the second dielectric layer 124 and the third dielectric layer 126 and contact the source electrode 132 and the drain electrode 142, respectively. The source metal layer 136 and the drain metal layer 146 are formed on the third dielectric layer 126 and are electrically connected to the source contact 134 and the drain contact 144, respectively.

Now back to FIG. 1, in some embodiments of the present disclosure, the extension direction of the source structure 130 is defined as a first direction (direction X), the direction from the source structure 130 toward the drain structure 140 is defined as a second direction (direction Y), and the direction from the source electrode 132 toward the source metal layer 136 is defined as a third direction (direction Z). Here, the directions X, Y, and Z are perpendicular to each other.

In some embodiments, the electric field modulation structure 170 includes an electric connection structure 172, a conductive layer 174, a first contact 176 and a pair of second contacts 177a and 177b.

In some embodiments, the electric connection structure 172 is electrically connected to the conductive layer 174. In some embodiments, the conductive layer 174 is disposed between the source structure 150 and the drain structure 140, and the electric connection structure 172 is electrically connected to the source structure 130 and the drain structure 140.

In the embodiment of FIG. 1, the electric connection structure 172 is electrically connected to the conductive layer 174 by the first contact 176. In addition, one end of the electric connection structure 172 is electrically connected to the source structure 130 by the second contact 177a, and the other end of the electric connection structure 172 is electrically connected to the drain structure 140 by the second contact 177b. In other words, one end of the electric connection structure 172 has the same electric potential as the source structure 130 and the other end of the electric connection structure 172 has the same electric potential as the drain structure 140.

Since the electric connection structure 172 has a certain degree of resistivity, the center (or middle) region of the electric connection structure 172 has electric potential different from that of both ends. That is, as long as the position of the first contact 176 and the conductive layer 174 connected to the electric connection structure 172 is different from the position of the source structure 130 and that of the drain structure 140 connected to the electric connection structure 172, the electric potential of the first contact 176 and the conductive layer 174 will be different from the electric potential of the source structure 130 and that of the drain structure 140.

In some embodiments, the electric potential of the first contact 176 and the conductive layer 174 between the source structure 130 and the drain structure 140 may be also between the electric potential of the source structure 130 and that of the drain structure 140.

By disposing the electric potential of the first contact 176 and the conductive layer 174 different from the electric potential of the source structure 130 and that of the drain structure 140, the electric field distribution may be optimized.

In addition, in the embodiment of FIG. 1, the first contact 176 and the conductive layer 174 are disposed between the gate structure 150 and the drain structure 140. By this configuration, the gate structure 150 may be prevented from suffering the high electric field intensity, thereby improving the performance of the semiconductor device.

In some embodiments, materials and formation of the first contact 176 and the second contact 177a/177b are similar to that of the source contact 134 and the drain contact 144, and thus are not repeated here.

In some embodiments, materials of the electric connection structure 172 and the conductive layer 174 may include semiconductor materials or metal materials.

The aforementioned metal materials include metal, metal silicide, and the like. Metal may be gold (Au), nickel (Ni), platinum (Pt), palladium (Pd), iridium (Ir), titanium (Ti), chromium (Cr), tungsten (W), aluminum (Al), copper (Cu), aluminum copper (AlCu), similar materials, a combination thereof, or multiple layers thereof. Metal silicide may be nickel silicide (SiNi), titanium silicide (SiTi$_2$), cobalt silicide (SiCo), similar materials, a combination thereof, or the multiple layers thereof. The aforementioned semiconductor materials may be doped or undoped amorphous silicon, polycrystalline silicon, polycrystalline germanium or gallium nitride (GaN), similar materials, a combination thereof, or the multilayers thereof.

In some embodiments, the electric connection structure 172 may include semiconductor materials and the conductive layer 174 may include metal materials, thereby further reaching the effect of saving energy. Specifically, when the electric connection structure 172 is undoped polycrystalline silicon and the conductive layer 174 is copper (Cu), the electric potential different from that of the source structure and the drain structure may be effectively generated without significant leakage.

In some embodiments, the resistivity of the electric connection structure 172 is between $10^6 \Omega$ and $10^8 \Omega$. Within the above range, the semiconductor device may reach optimized electric field distribution while saving energy.

In some embodiments, the electric connection structure 172, the conductive layer 174, the first contact 176 and the second contacts 177a and 177b may be formed by the deposition and patterning process which are similar to the above. The details are not described again herein to avoid repetition.

Next, referring to FIG. 2, FIG. 2 is a cross-sectional view illustrating a semiconductor device 100 along line A-A' shown in FIG. 1 according to some embodiments of the present disclosure. It should be noted that the gate structure 150 is positioned at the direction −X of line A-A'. However, in order to highlight the relative position of the gate structure 150 and other elements, the gate structure 150 is shown in "dash line".

In the embodiment of FIG. 2, the electric connection structure 172 is in direct contact with the barrier layer 116 and is embedded in the first dielectric layer 122, and both ends of the electric connection structure 172 is close to but does not contact the source electrode 132 and the drain electrode 142. In other words, the electric connection structure 172 is spaced apart from the source electrode 132 and the drain electrode 142 by the first dielectric layer 122. In addition, the top surface of the electric connection structure 172, the top surface of the source electrode 132, and the top surface of the drain electrode 142 are substantially level with the top surface of the first dielectric layer 122.

In addition, in the embodiment of FIG. 2, the height of the first contact 176 and that of the second contacts 177a and 177b are substantially the same as that of the source contact 134 and the drain contact 144, so that the source metal layer 136, the drain metal layer 146 and the conductive layer 174 are at the same level.

In addition, in the embodiment of FIG. 2, in the second direction (direction Y), the length L of the electric connection structure 172 may be greater than the distance between the source metal layer 136 and the drain metal layer 146, but may be less than the distance between the source electrode 132 and the drain electrode 142.

In addition, in the embodiment of FIG. 2, the source electrode 132 and the drain electrode 142 are electrically connected to the electric connection structure 172 by the contact (such as the source contact 134, the drain contact 144, the second contacts 177a and 177b), and the overlying metal layer (such as the source metal layer 136 and the drain metal layer 146) to ensure the formation of ohmic contact.

In the embodiment of FIG. 2, in the second direction (direction Y), the source structure 130, the gate structure 150, the conductive layer 174, and the drain structure 140 are arranged in order.

In addition, in the second direction (direction Y), the conductive layer 174 may or may not overlap the gate structure 150, as long as the operation of the device is not affected.

In addition, the gate electrode 152 along with the doped compound semiconductor layer 156, and the electric connection structure 172 are disposed at the same level, while the gate metal layer 154 and the electric connection structure 172 are disposed at different levels. In other words, in the third direction (direction Z), the gate metal layer 154 and the electric connection structure 172 are disposed at different positions.

In addition, the gate metal layer 154 is disposed between the first contact 176 and the second contact 177a. Also, the first contact 176 is spaced apart from the second contact 177a by the second dielectric layer 124 to avoid short-circuiting.

Figure 3:
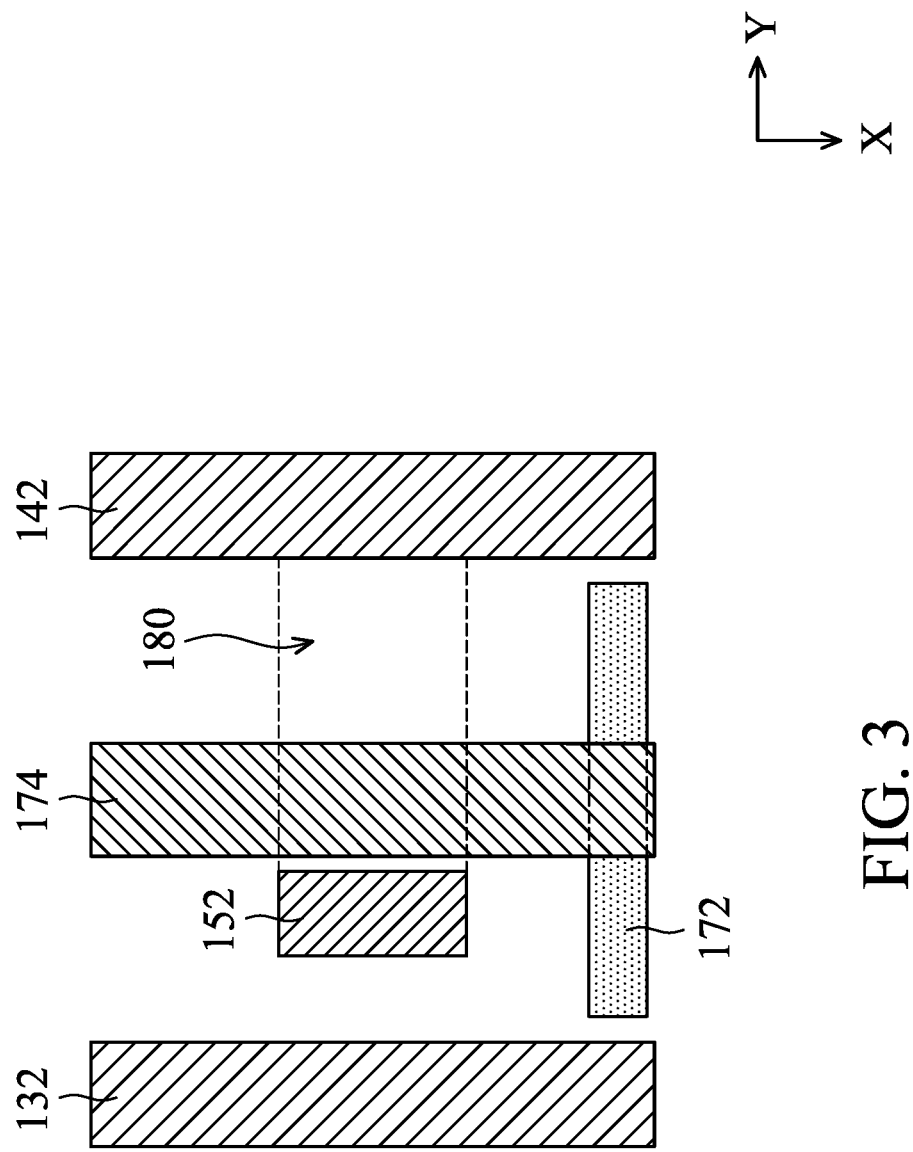
FIG. 3 is a top view illustrating partial elements of a semiconductor device shown in FIG. 1 according to some embodiments of the present disclosure.

Next, referring to FIG. 3, FIG. 3 is a top view illustrating partial elements of a semiconductor device 100 shown in FIG. 1 according to some embodiments of the present disclosure. Specifically, in FIG. 3, the source electrode 132, the gate electrode 152, the drain electrode 142, the electric connection structure 172, and the conductive layer 174 are projected to the XY plane to depict the relative positions. Here, the electric connection structure 172 overlapped with and below the conductive layer 174 is shown in "dash line".

In the embodiments of FIG. 3, the region (shown in "dash line" in FIG. 3) defined by opposite ends of the gate electrode 152 extending to the drain electrode 142 in the second direction (direction Y) is referred to as the access region 180. The access region 180 is usually used to improve the breakdown voltage of the device. The greater the length of the access region 180 along the second direction, the greater the withstand voltage.

In the embodiment of FIG. 3, the conductive layer 174 spans over the access region 180, and the electric connection structure 172 is disposed outside the access region 180. In such way, the electric connection structure 172 may optimize the electric field distribution without affecting the operation of the device through the conductive layer 174 to reduce the electric field intensity of the gate structure 150 at the side of the drain structure 140 (direction +Y).

Figure 4:
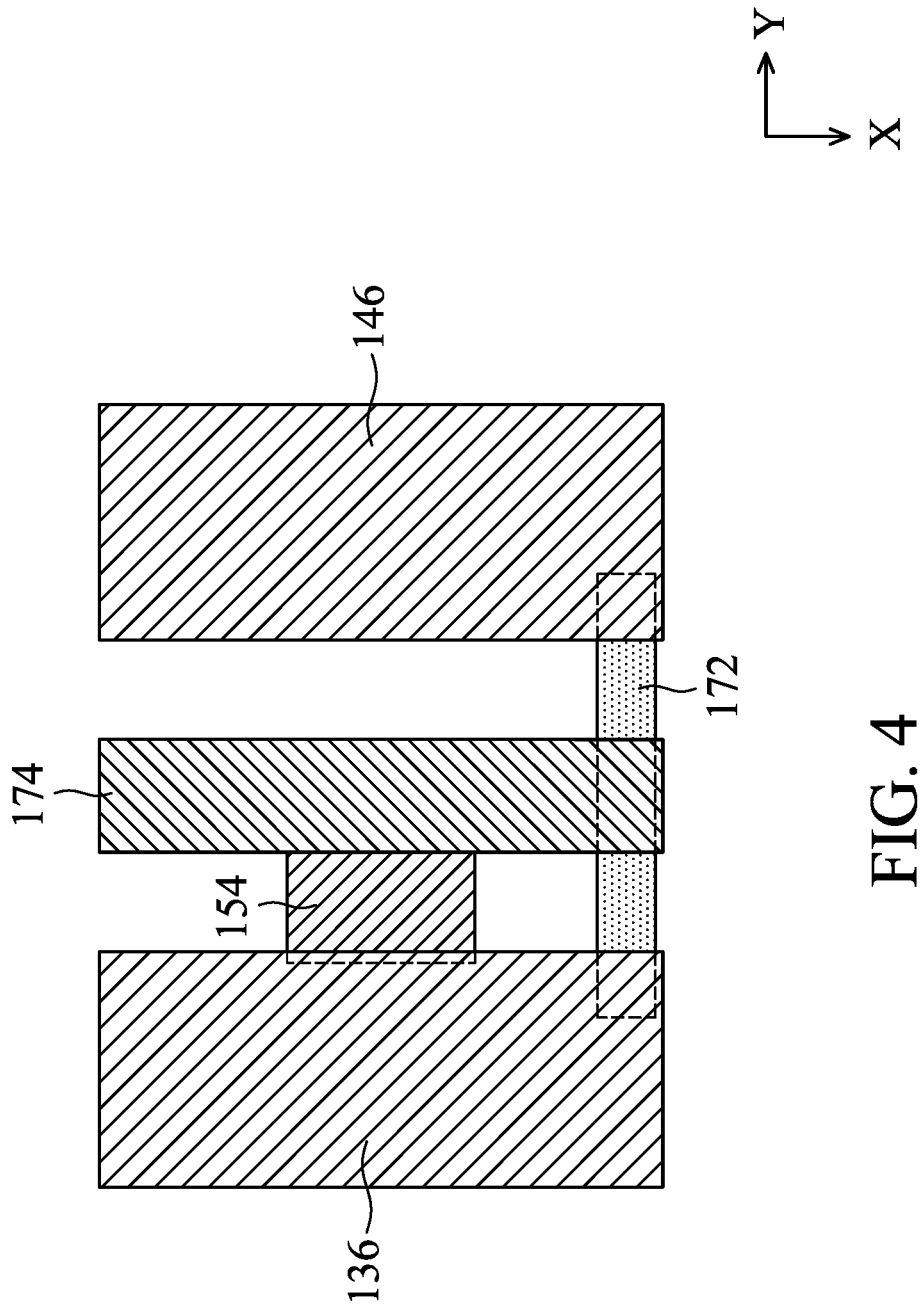
FIG. 4 is a top view illustrating a semiconductor device corresponding to FIG. 1 according to some embodiments of the present disclosure.

Next, referring to FIG. 4, FIG. 4 is a top view illustrating a semiconductor device 100 corresponding to FIG. 1 according to some embodiments of the present disclosure. It should be noted that in order to simplify the figures and highlight the relative relationship of other elements, the dielectric layer 120 between the features is not shown here. In FIG. 4 and the subsequent top views, the gate metal layer 154 overlapped with and below the source metal layer 136, and the electric connection structure 172 overlapped with and below the source metal layer 136, the gate metal layer 154, or the conductive layer 174 are shown in "dash line".

In the embodiment of FIG. 4, the source metal layer 136, the gate metal layer 154, the conductive layer 174, and the drain metal layer 146 extend in the first direction (direction X), while the electric connection structure 172 extends in the second direction (direction Y).

In addition, in the second direction (direction Y), the source metal layer 136, the conductive layer 174 and the drain metal layer 146 are overlapped with and over the electric connection structure 172. In addition, in the first direction (direction X), the electric connection structure 172 and the source metal layer 136 are overlapped.

Figure 5:
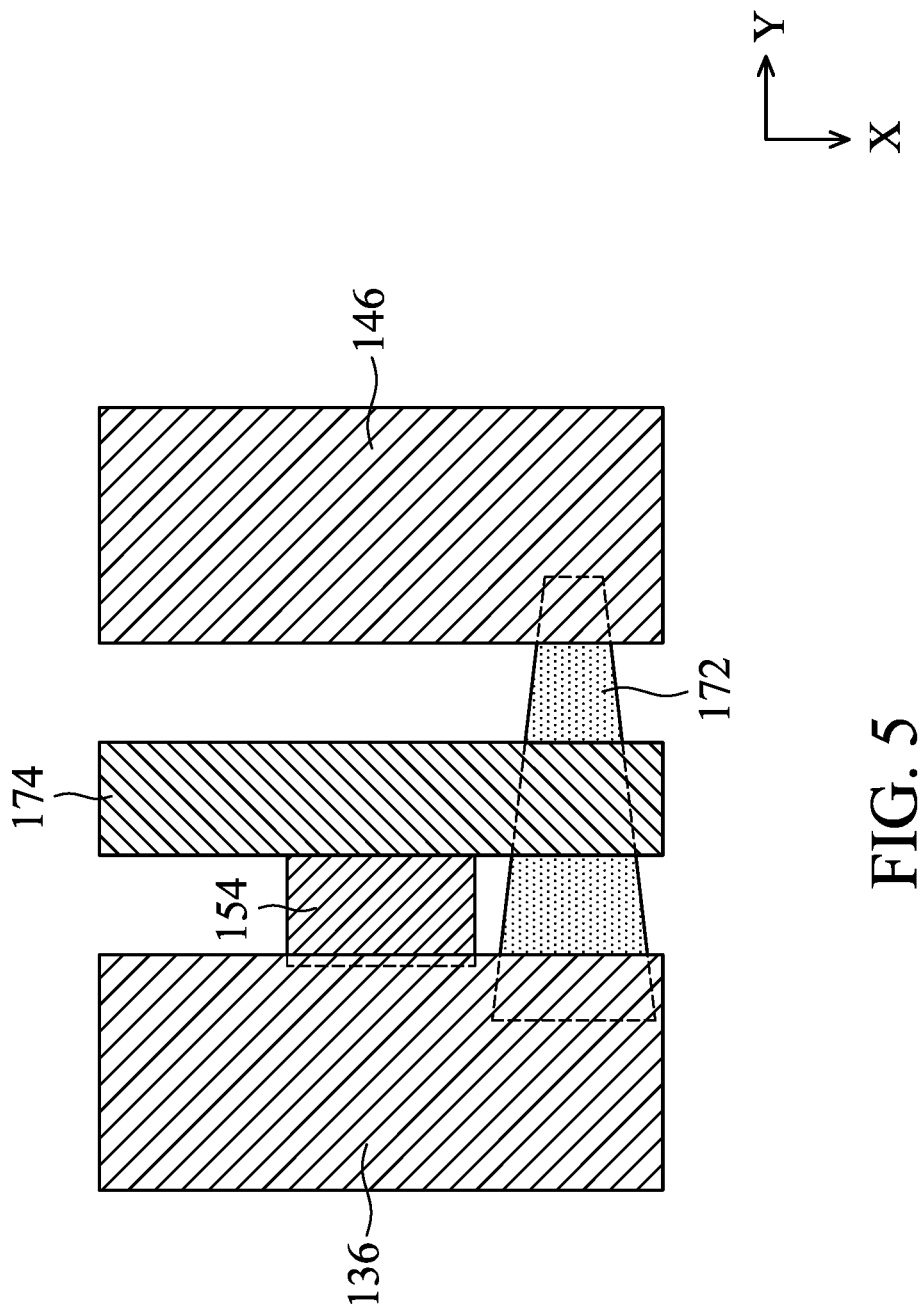
FIG. 5 is a top view illustrating a semiconductor device according to other embodiments of the present disclosure.
Figure 6:
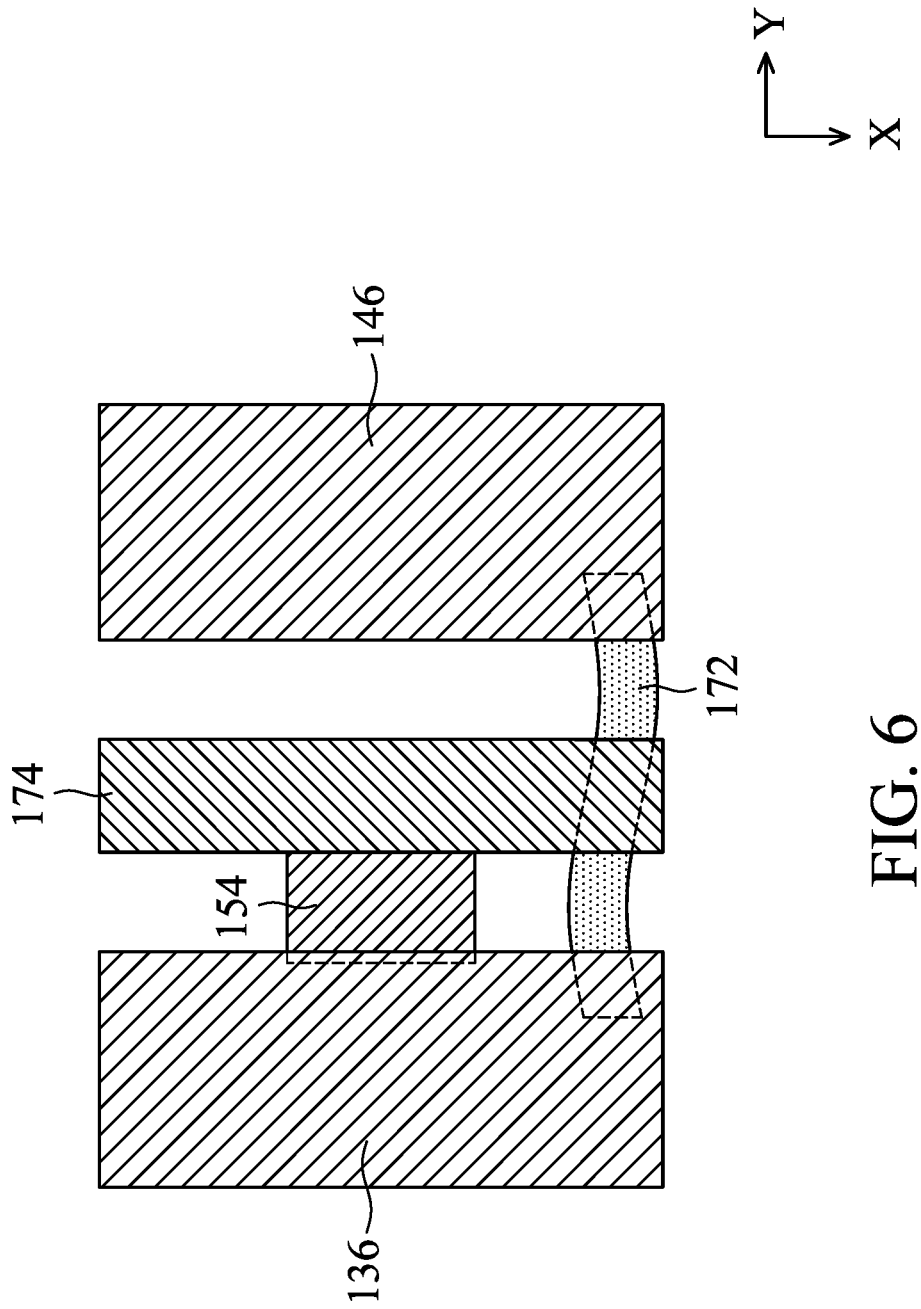
FIG. 6 is a top view illustrating a semiconductor device according to other embodiments of the present disclosure.

Next, referring to FIG. 4 along with FIGS. 5-6, the relationship of the shape of the electric connection structure 172 and the conductive layer 174 electrically connected to the electric connection structure 172 is illustrated. FIG. 5 is a top view illustrating a semiconductor device according to other embodiments of the present disclosure. FIG. 6 is a top view illustrating a semiconductor device according to other embodiments of the present disclosure.

In the embodiment of FIG. 4, in the first direction (direction X), the position of the electric connection structure 172 is fixed, while in the second direction (direction Y), the electric connection structure 172 exhibits linear relationship between the source structure 130 and the drain structure 140. Accordingly, linear relationship is exhibited between the electric potential and the position in the second direction (direction Y) of the conductive layer 174 electrically connected to the electric connection structure 172.

For example, when both ends of the electric connection structure 172 are electrically connected to the source structure 130 and the drain structure 140, respectively, the electric potential of the drain structure 140 is 600V, the electric potential of the source structure 130 is 0V (grounded). Thus, the electric potential of the center (or the middle) of the electric connection structure 172 is 300V, and the electric potential of the first contact 176 and the conductive layer 174 electrically connected to the center (or the middle) of the electric connection structure 172 is also 300V.

In other words, in the embodiment of FIG. 4, the electric potential of the first contact 176 and the conductive layer 174 may depend on the position (or the node) where the first contact 176 is electrically connected to the electric connection structure 172.

In other embodiments, such as embodiments of FIG. 5 and FIG. 6, the electric connection structure 172 is asymmetric with respect to the midline of the source structure 130 and the drain structure 140. In such situation, non-linear relationship may be exhibited between the electric potential and the position in the second direction (direction Y) of the conductive layer 174 electrically connected to the electric connection structure 172.

Specifically, in the embodiment of FIG. 5, the length in the first direction (direction X) of the electric connection structure 172 becomes smaller along the second direction (direction +Y), and thus exhibits trapezoidal-shaped. In the embodiment of FIG. 6, the position in the first direction (direction X) of the electric connection structure 172 varies with the second direction (direction Y), and thus exhibits curve-shaped. In these cases, non-linear relationship is exhibited between the electric potential and the position in the second direction of the conductive layer 174 electrically connected to the electric connection structure 172.

In the present disclosure, the electric connection structure 172 is connected in parallel to one end of the drain structure 140 and one end of the source structure 130, and the conductive layer 174 electrically connected to the electric connection structure 172 is disposed between the drain structure 140 and the source structure 130. In this way, the electric field may be modulated, and thus the surface electric field of the access region 180 may be increased, thereby reducing the surface electric field close to the gate structure 150 and the source structure 130.

In addition, the electric field modulation structure 170 provided by the present disclosure may form an additional conductive path, which may prevent the carriers (such as electrical charges) from being trapped (such as in the medium, for example, dielectric layer). Thus, the generation of thermionic electrons is further avoided, thereby improving the performance of the semiconductor device.

Figure 7:
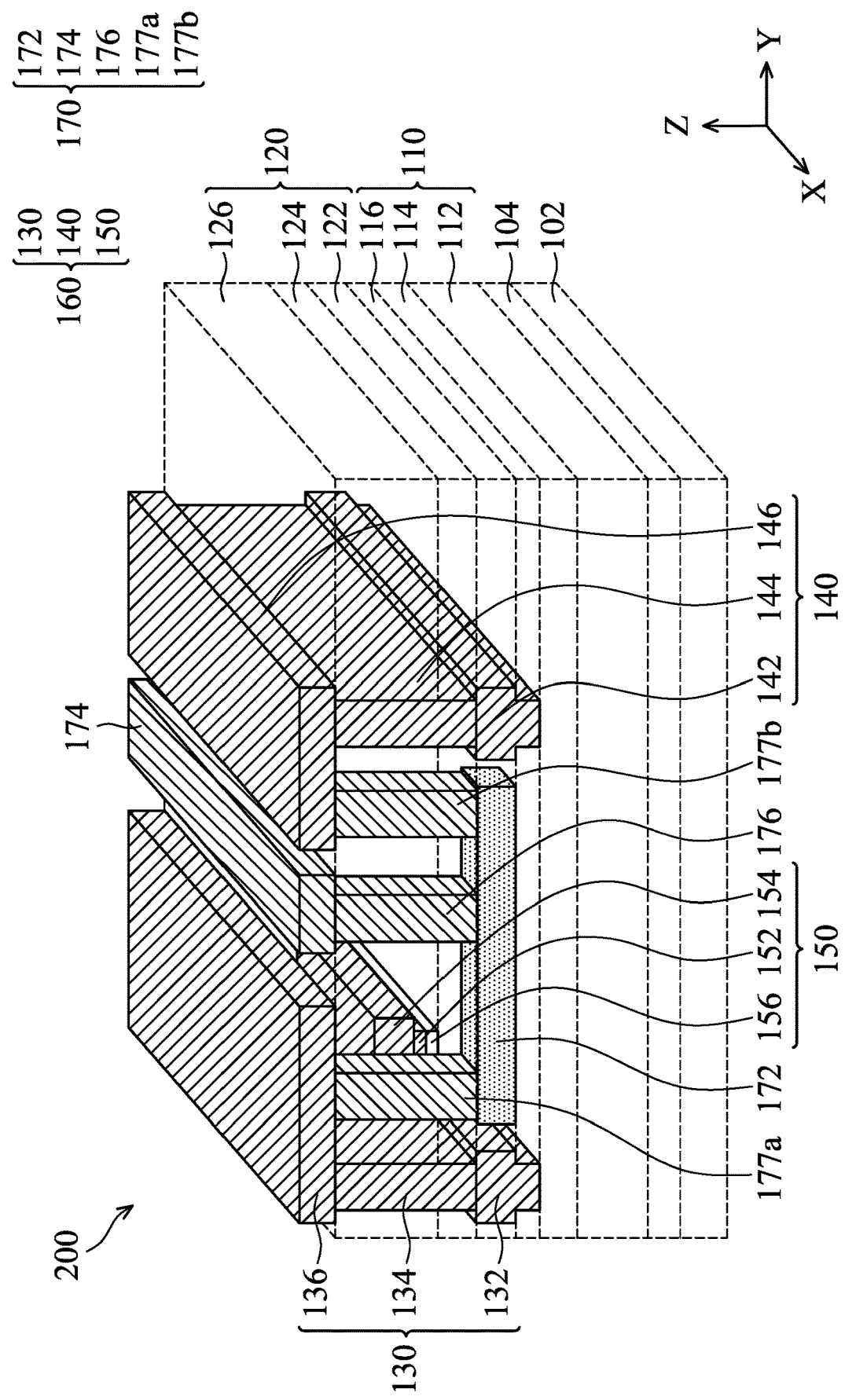
FIG. 7 is a partial perspective view illustrating an exemplary semiconductor device according to other embodiments of the present disclosure.

FIG. 7 is a partial perspective view illustrating an exemplary semiconductor device 200 according to other embodiments of the present disclosure. The semiconductor device 200 illustrated in FIG. 7 is substantially similar to the semiconductor structure 100 illustrated in FIG. 1, the difference being that the source structure 130 completely covers the gate structure 150. Specifically, the source metal layer 136 may serve as a source field plate and may extend beyond the gate structure 150. In such way, the electric field intensity of the gate structure 150 at the side (direction +Y) close to the drain structure 140 may be reduced.

Figure 8:
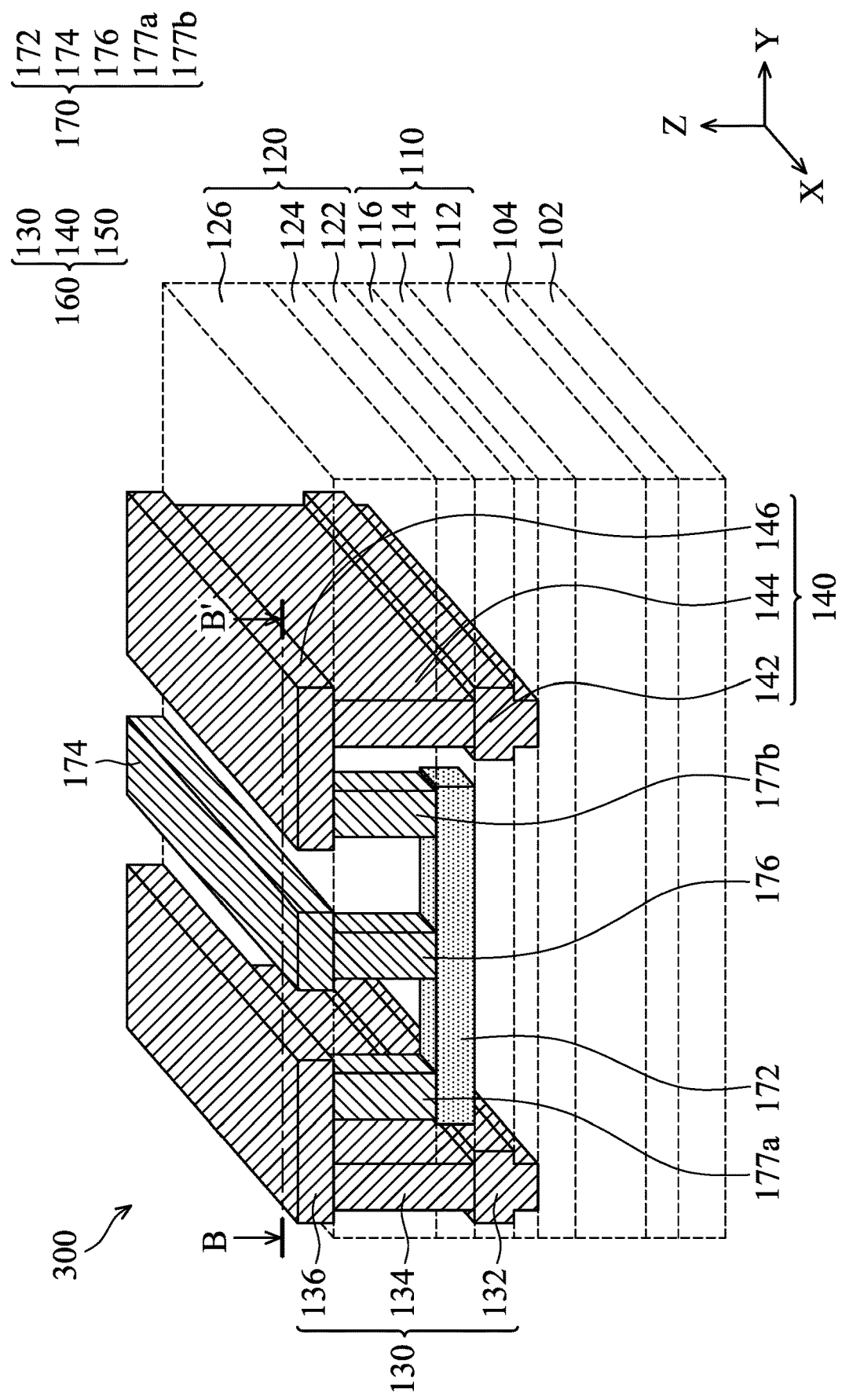
FIG. 8 is a partial perspective view illustrating an exemplary semiconductor device according to other embodiments of the present disclosure.
Figure 9:
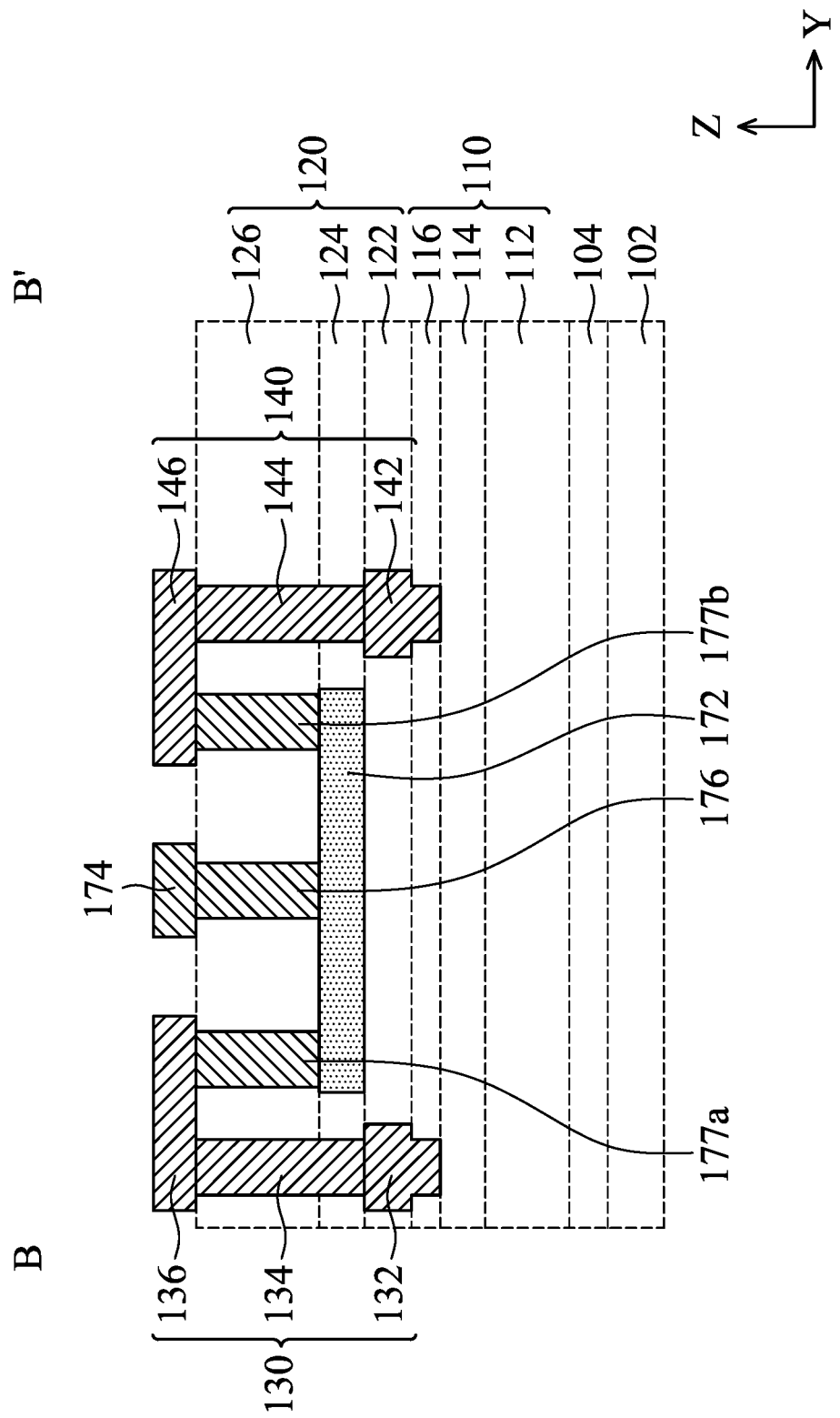
FIG. 9 is a cross-sectional view illustrating a semiconductor device along line B-B' shown in FIG. 8 according to some embodiments of the present disclosure.

Now referring to FIG. 8 along with FIG. 9, FIG. 8 is a partial perspective view illustrating an exemplary semiconductor device 300 according to other embodiments of the present disclosure, and FIG. 9 is a cross-sectional view illustrating a semiconductor device along line B-B' shown in FIG. 8 according to some embodiments of the present disclosure.

It should be noted that in the FIG. 8 and the following views, the gate structure 150 is omitted to simplify the figures and highlight the relative relationship of other elements.

The semiconductor device 300 illustrated in FIG. 8 is substantially similar to the semiconductor structure 100 illustrated in FIG. 1, the difference being that the electric connection structure 172 is embedded in the second dielectric layer 124. In other words, the electric connection structure 172 is spaced apart from the epitaxial layer 110 by the first dielectric layer 122 and is disposed in the level different from the source electrode 132 and the drain electrode 142. By disposing the electric connection structure 172 in a region withstanding higher voltage (such as the position far from the epitaxial layer 110), impact ionization may be reduced, thereby improving the breakdown voltage and the reliability of the device.

In the embodiment of FIG. 8, materials of the electric connection structure 172 may include semiconductor materials and materials of the conductive layer 174 may include metal materials. In some embodiments, the electric connection structure 172 is polycrystalline silicon and the conductive layer 174 is copper (Cu). In the embodiment, the electric connection structure 172 is prevented from directly contacting the epitaxial layer 110, thus preventing the electric connection structure 172 from adversely affecting the operation of the underlying epitaxial layer 110.

Next, still referring to FIG. 9, in the embodiment of FIG. 9, the bottom surface of the electric connection structure 172 is level with the upper surface of the source electrode 132, the upper surface of the drain electrode 142, and the upper surface of the first dielectric layer 122. In addition, in the third direction (direction Z), the electric connection structure 172 is positioned between the source electrode 132 and the source metal layer 136. Therefore, in the third direction (direction Z), the height of the first contact 176 and that of the second contacts 177a and 177b are less than the height of the source contact 136 and that of the drain contact 146.

Figure 10:
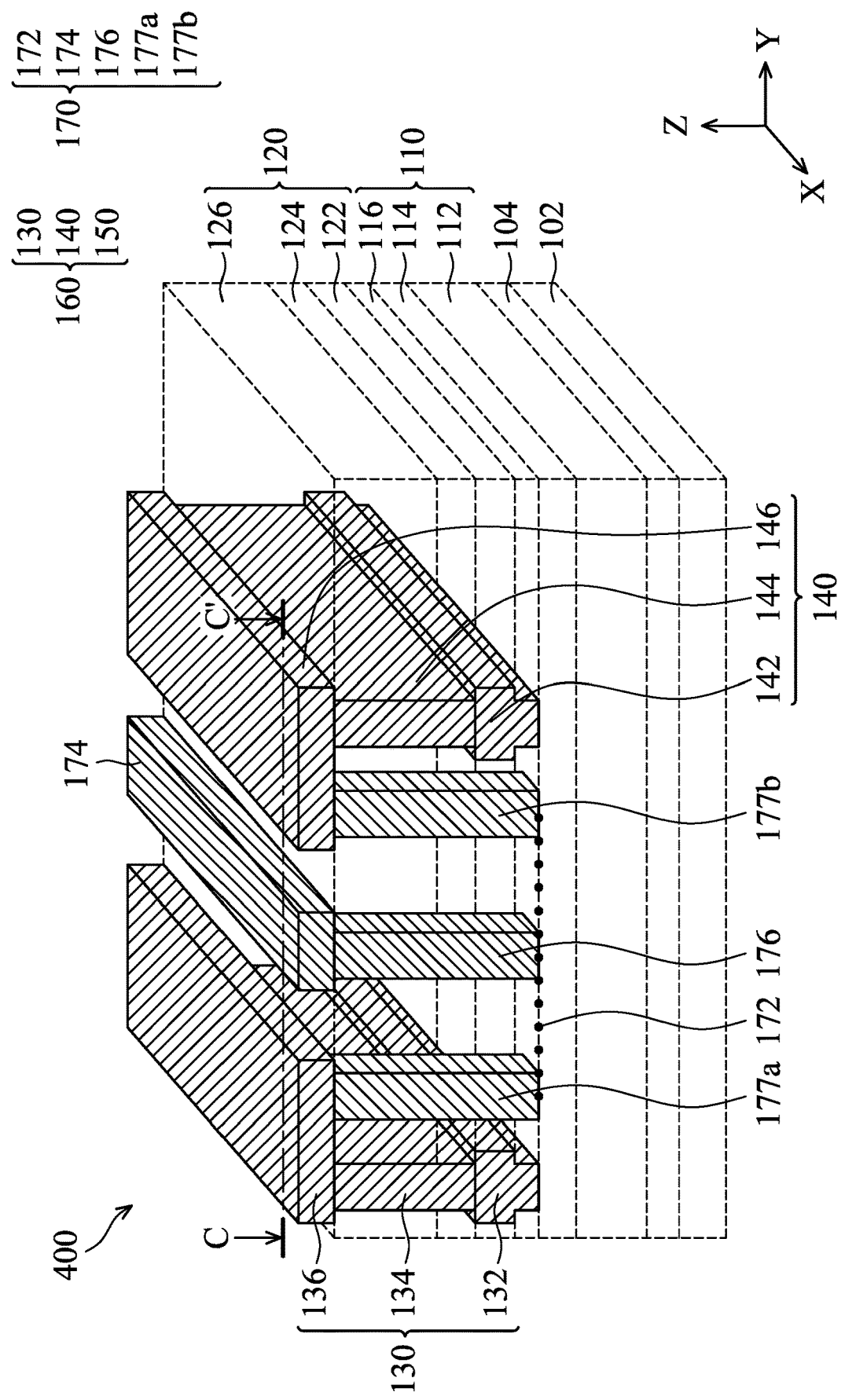
FIG. 10 is a partial perspective view illustrating an exemplary semiconductor device according to other embodiments of the present disclosure.
Figure 11:
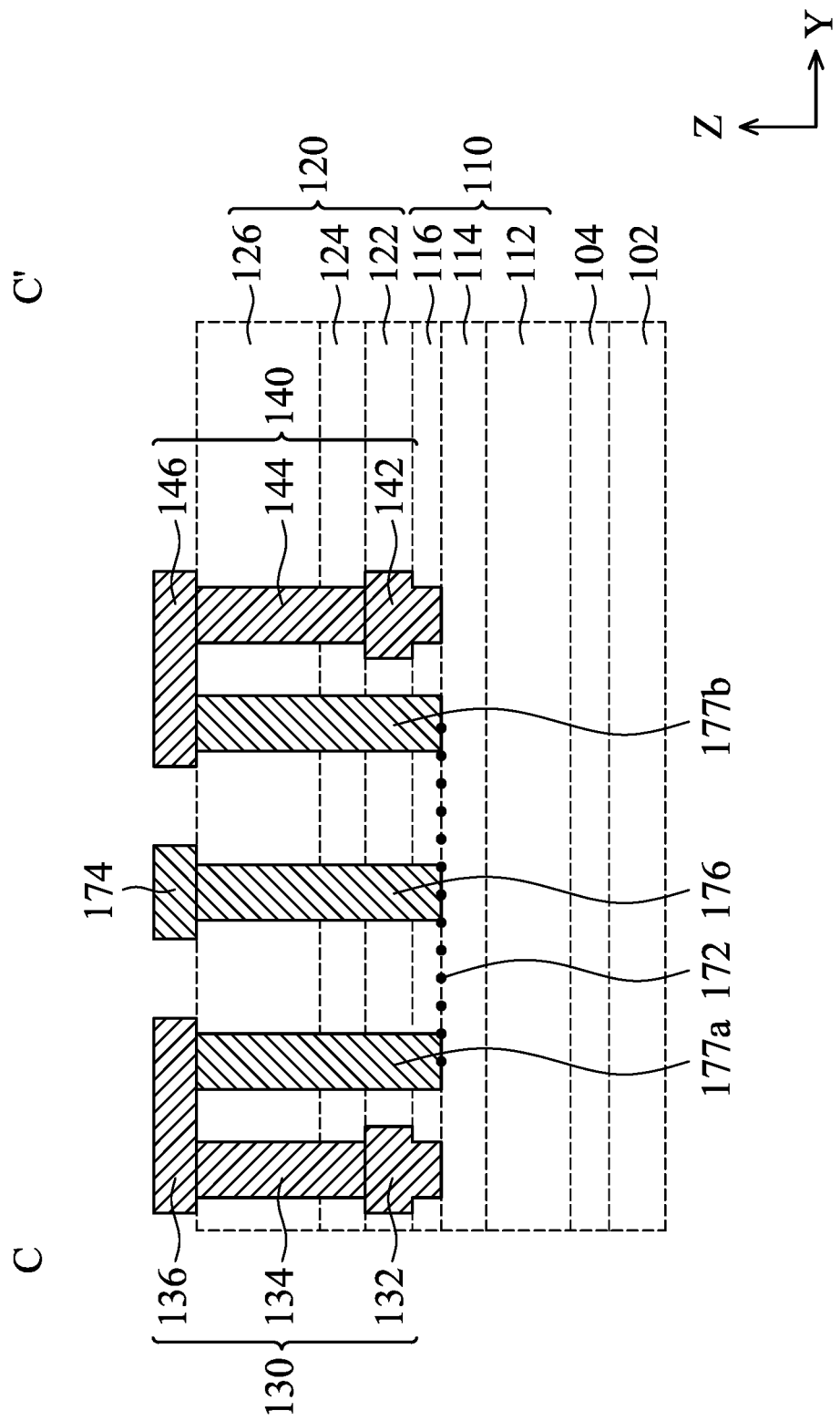
FIG. 11 is a cross-sectional view illustrating a semiconductor device along line C-C' shown in FIG. 10 according to some embodiments of the present disclosure.

Now referring to FIG. 10 along with FIG. 11, FIG. 10 is a partial perspective view illustrating an exemplary semiconductor device 400 according to other embodiments of the present disclosure and FIG. 11 is a cross-sectional view illustrating a semiconductor device along line C-C' shown in FIG. 10 according to some embodiments of the present disclosure.

The semiconductor device 400 illustrated in FIG. 10 is substantially similar to the semiconductor structure 100 illustrated in FIG. 1, the difference being that the first contact 176 and the second contacts 177a and 177b penetrate further through the first dielectric layer 122 and the barrier layer 116 and contact the channel layer 114, and the two-dimensional electron gas (2DEG) positioned at the interface of the barrier layer 116 and the channel layer 114 acts as the electric connection structure 172. Specifically, the position of the two-dimensional electron gas (2DEG) contacting the first contact 176 and the second contacts 177a and 177b are different from the position of the two-dimensional electron gas (2DEG) contacting the source structure 130 and the drain structure 140. In such way, the electric potential different from the source structure 130 and the drain structure 140 may be generated, thereby increasing the field plate effect and improving the performance of the semiconductor device.

Next, referring to FIG. 11, when the switch is on, the two-dimensional electron gas (2DEG) flows between the source electrode 132 and the drain electrode 142, and the two-dimensional electron gas (2DEG) between the second contacts 177a and 177b acts as the electric connection structure 172. In such way, the electric connection structure 172 (or the two-dimensional electron gas (2DEG) 172) may provide the electric potential different from the source electrode 132 and the drain electrode 142 while reducing the complexity.

Figure 12:
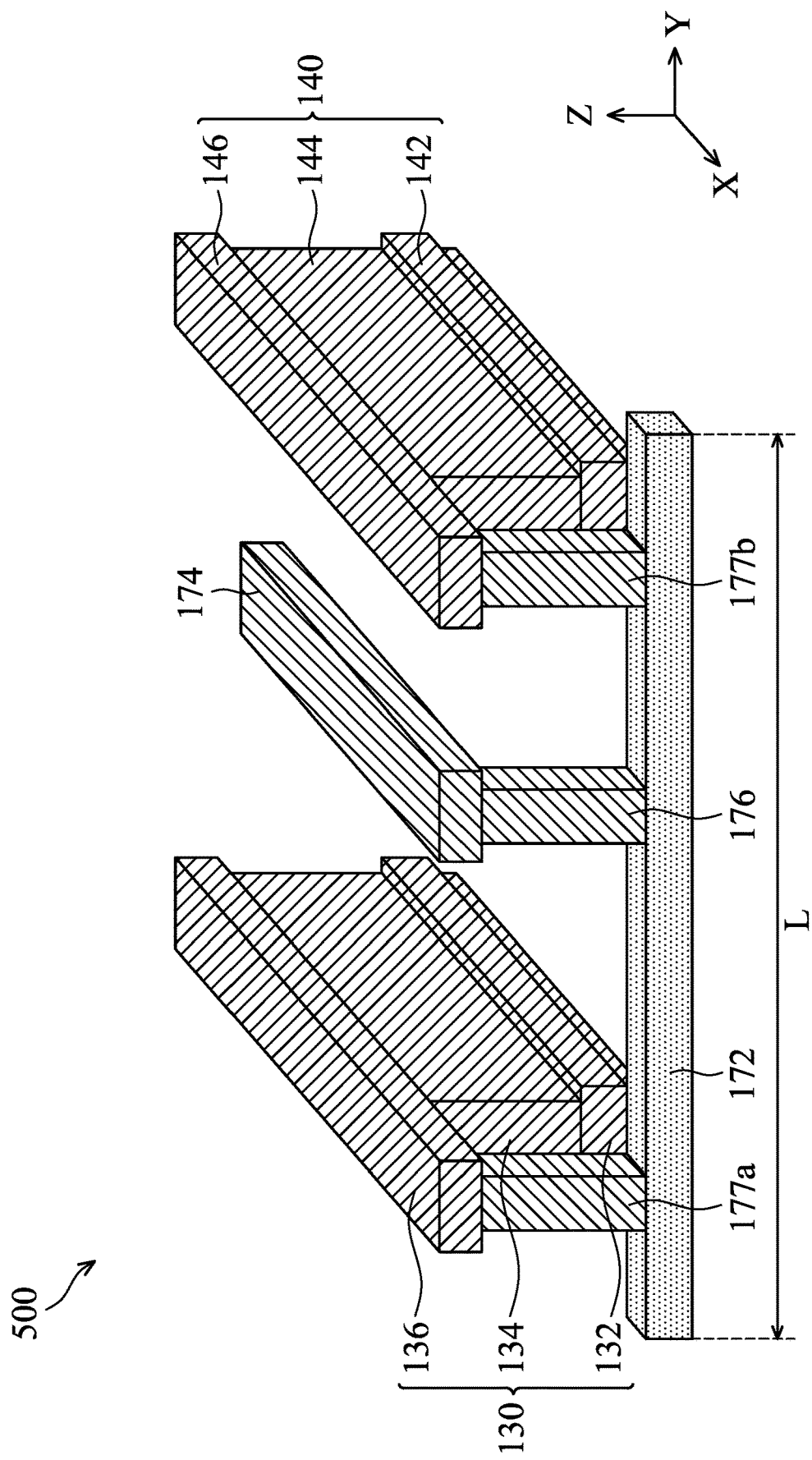
FIGS. 12-14 are partial perspective views illustrating an exemplary semiconductor device according to other embodiments of the present disclosure.

FIG. 12 is a partial perspective view illustrating an exemplary semiconductor device 500 according to other embodiments of the present disclosure. It should be noted that in FIG. 12 and the following views, the films (such as the dielectric layer 120, the epitaxial layer 110 and the like) between and below electrode structure 160 and the electric modulation structure 170 are omitted to simplify the figures and highlight the relative relationship of other elements.

The semiconductor device 500 illustrated in FIG. 12 is substantially similar to the semiconductor structure 100 illustrated in FIG. 1, the difference being that the electric connection structure 172 is not disposed between the source electrode 132 and the drain electrode 142. Specifically, in the first direction (direction X), the electric connection structure 172 is not overlapped with the source contact 134 and the source electrode 132. In other words, in the first direction (direction X), the electric connection structure 172 is spaced apart from the source electrode 132 and the source contact 134 by the dielectric layer (not shown). On the other hand, in the first direction (direction X), the electric connection structure 172 is overlapped with a portion of the source metal layer 136.

In addition, since the electric connection structure 172 is not disposed between the source electrode 132 and the drain electrode 142, the length L of the electric connection structure 172 in the second direction (direction Y) is greater than the distance between the source electrode 132 and the drain electrode 142. In other words, the electric connection structure 172 extends beyond the drain structure 140 in the direction +Y, and also extends beyond the source structure 130 in the direction −Y. Accordingly, the length of the electric connection structure may be adjusted depending on the actual requirements to facilitate the manufacture of the device.

Figure 13:
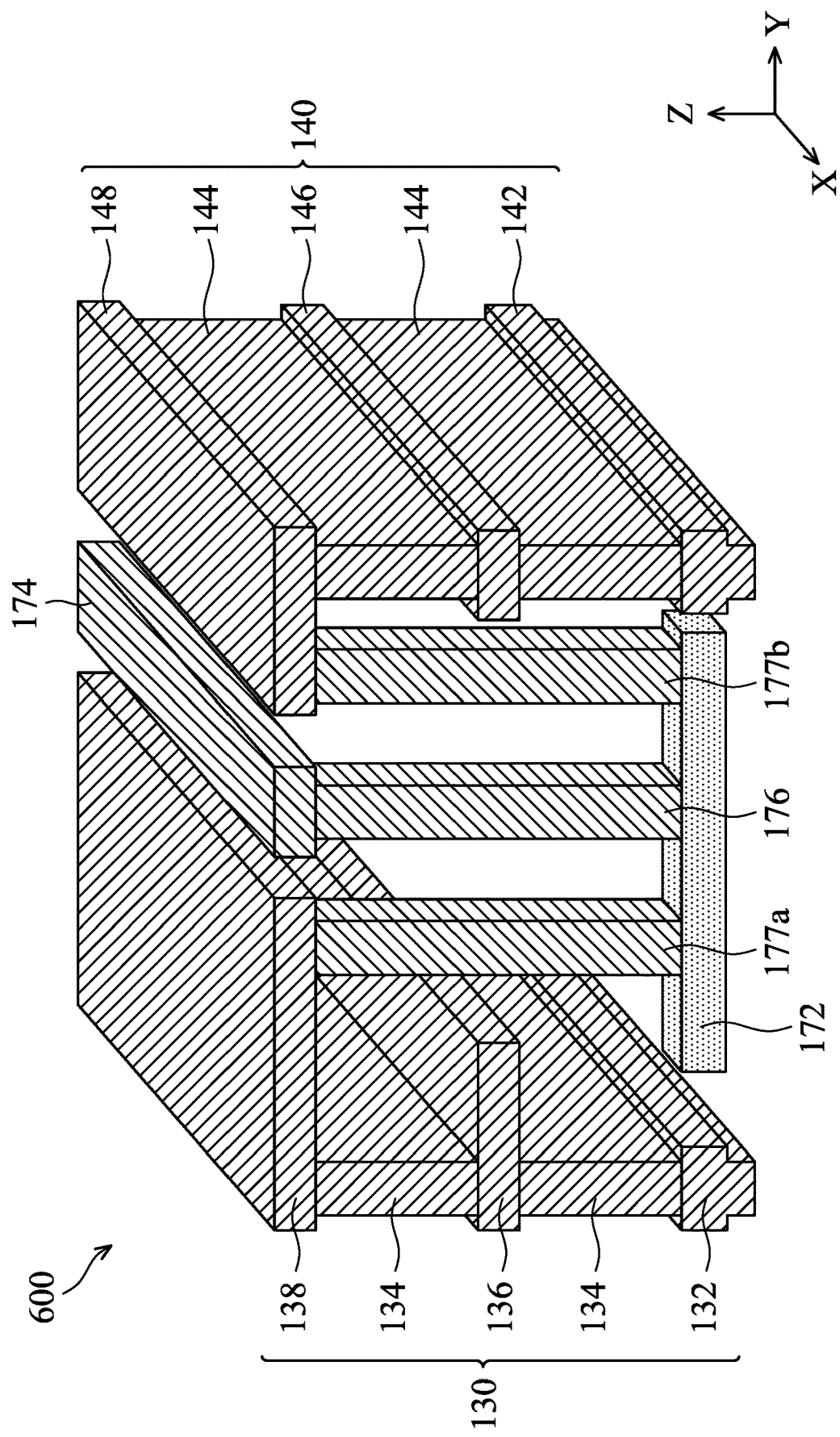

FIG. 13 is a partial perspective view illustrating an exemplary semiconductor device 600 according to other embodiments of the present disclosure. The semiconductor device 600 illustrated in FIG. 13 is substantially similar to the semiconductor structure 100 illustrated in FIG. 1, the difference being that another source metal layer 138 and another drain metal layer 148 are further formed over the source metal layer 136 and the drain metal layer 146, respectively. Specifically, the source metal layer 138 and the drain metal layer 148 are electrically connected to the source electrode 132 and the drain electrode 142, respectively. Also, the source metal layer 138 and the drain metal layer 148 are electrically connected to the electric connection structure 172 by the second contacts 177a and 177b.

In this embodiment, the source metal layer 138 extends toward direction +Y and extends beyond the source metal layer 136. In other words, in the top view (not shown), the source metal layer 138 may completely cover the source metal layer 136. In such way, the field plate effect may be increased, thereby reducing the impact or adverse effect of the high electric field to the source structure.

In addition, in this embodiment, the second contacts 177a and 177b extend toward the third direction (direction +Z) and extend beyond the source metal layer 136 and the drain metal layer 146, and thus contact the source metal layer 138 and the drain metal layer 148. Also, the second contacts 177a and 177b do not directly contact the source metal layer 136 and the drain metal layer 146. For example, the second contacts 177a and 177b are spaced apart from the source metal layer 136 and the drain metal layer 146 by the dielectric layer (not shown).

In addition, the first contact 176 extends in the third direction (direction +Z) and contacts the conductive layer 174. In other words, one end of the first contact 176 contacts the conductive layer 174 and the other end of the first contact 176 contacts the electric connection structure 172.

In this embodiment, the conductive layer 174, the source metal layer 138, and the drain metal layer 148 are at the same level. In such way, the electric field distribution of the device may be modified without affecting the operation of the device.

Figure 14:
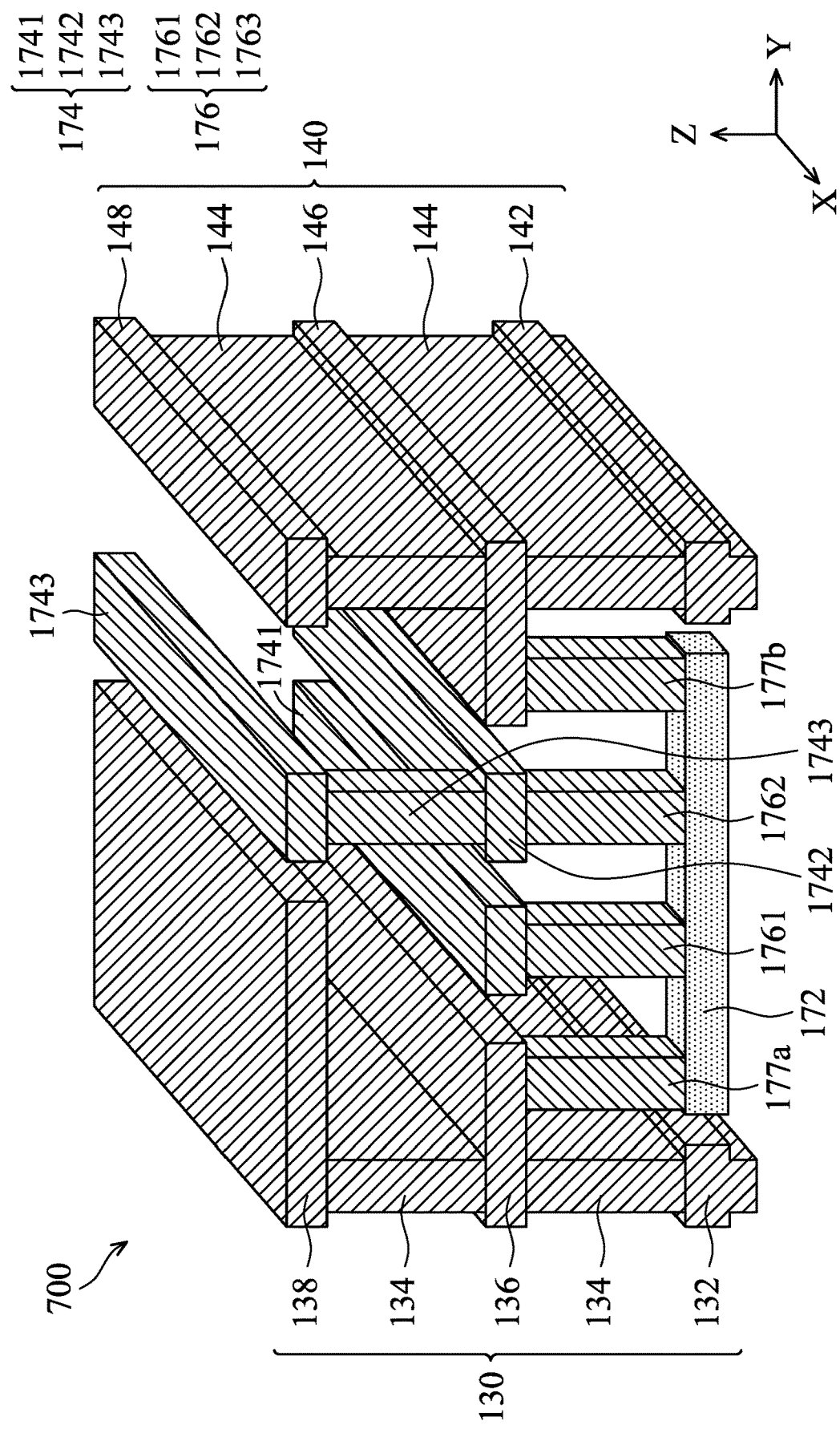

FIG. 14 is a partial perspective view illustrating an exemplary semiconductor device 700 according to other embodiments of the present disclosure. The semiconductor device 700 illustrated in FIG. 14 is substantially similar to the semiconductor structure 100 illustrated in FIG. 1, the difference being that another source metal layer 138 and another drain metal layer 148 are further formed over the source metal layer 136 and the drain metal layer 146, respectively. Also, the conductive layer 174 includes three conductive layers 1741, 1742, and 1743, which are electrically connected to the electric connection structure 172.

Specifically, in the level same as the source metal layer 136 and the drain metal layer 146, the conductive layer 1741 and the conductive layer 1742 are disposed, while in the level same as the source metal layer 138 and the drain metal layer 148, the conductive layer 1743 is disposed. In such way, at the position close to the gate structure (not shown), the electric field may be dramatically reduced, while at the position far from the gate structure (not shown), the electric field distribution may be optimized, thereby improving the performance of the semiconductor device.

In this embodiment, the first contact 176 includes the first contacts 1761, 1762 and 1763, which are electrically connected to the conductive layer 1741, 1742, and 1743, respectively. In other words, one contact is corresponding to one conductive layer. Since the materials and the formation of each of the first contact 1761, 1762, and 1763 and that of each of the conductive layer 1741, 1742, and 1743 are similar to the mentioned above, and thus are not repeated here.

In this embodiment, the electric field may be further reduced by extending the source metal layer 138 toward the second direction (direction +Y).

Figure 15:
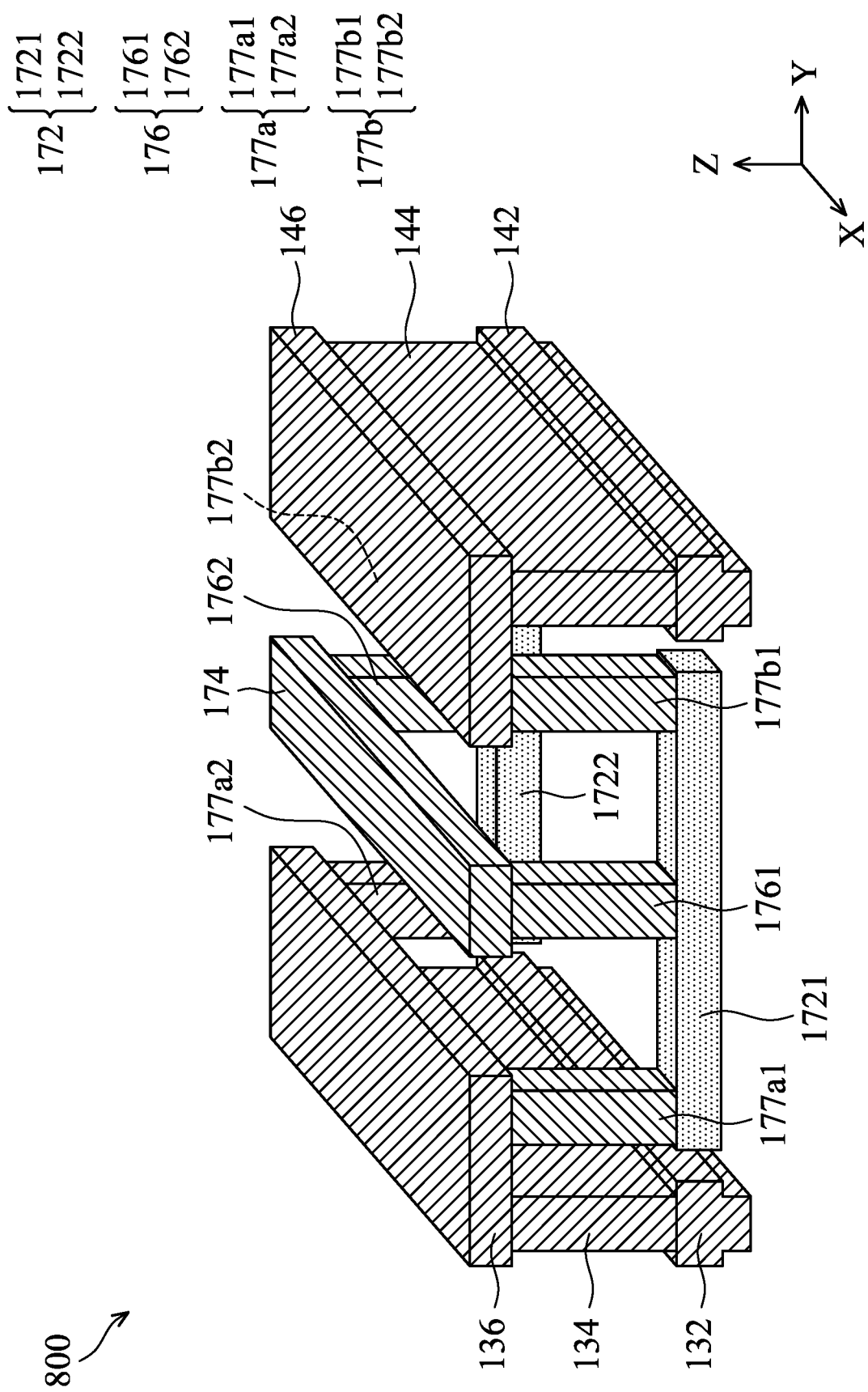
FIG. 15 is a partial perspective view illustrating an exemplary semiconductor device according to other embodiments of the present disclosure.
Figure 16:
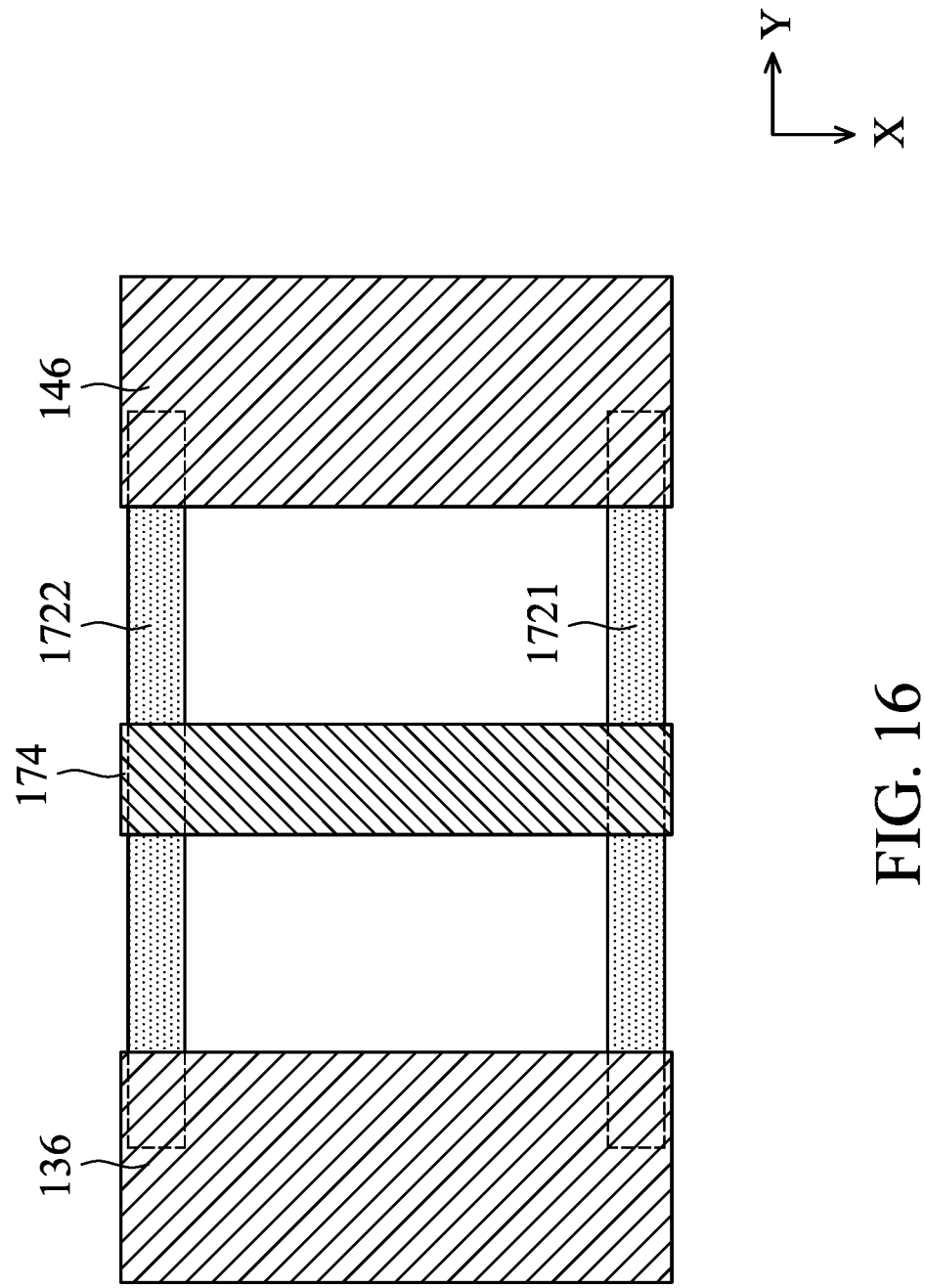
FIG. 16 is a top view illustrating a semiconductor device corresponding to FIG. 15 according to some embodiments of the present disclosure.
Figure 17:
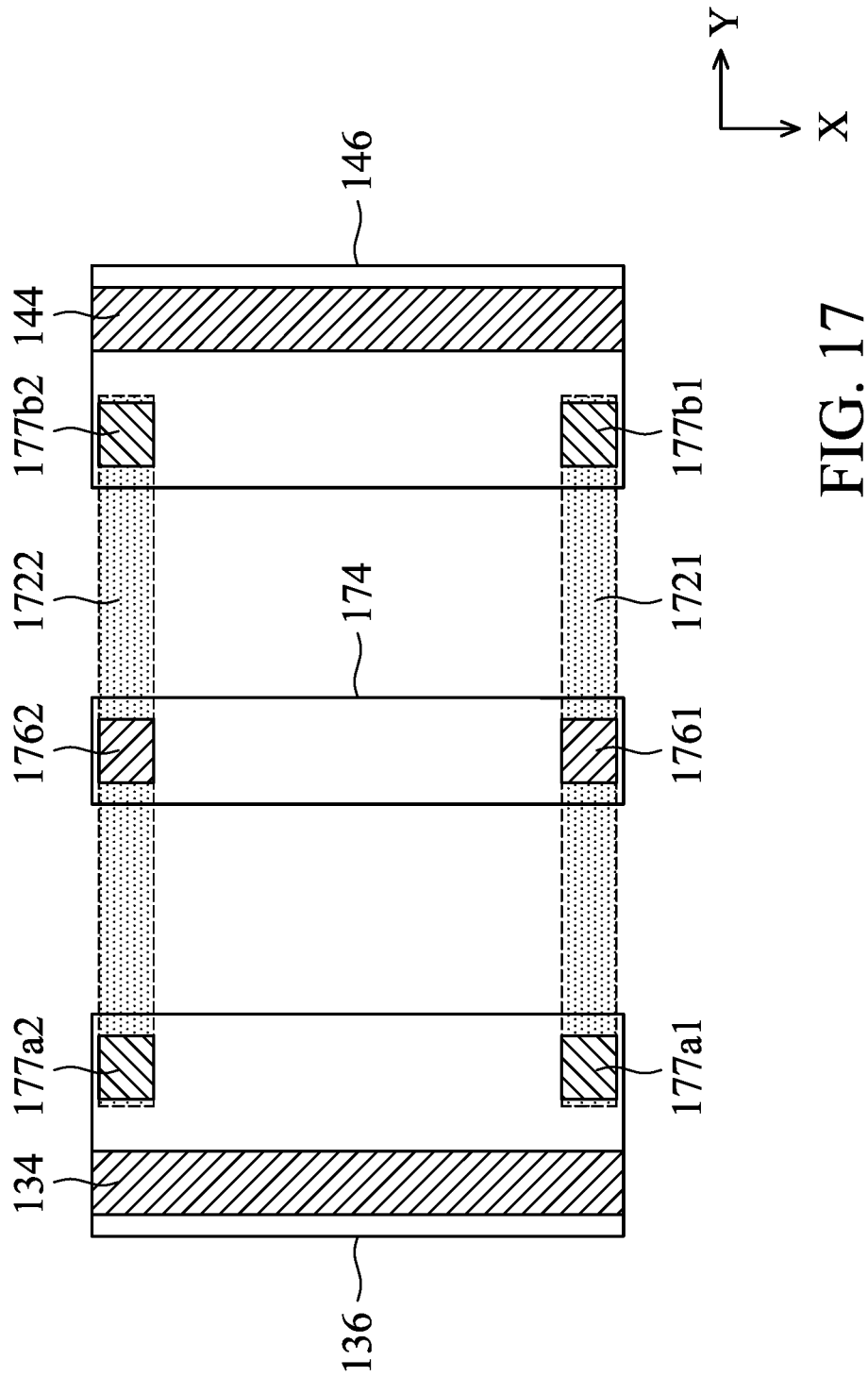
FIG. 17 is a projection view illustrating partial elements of a semiconductor device shown in FIG. 15 projecting to XY plane along +Z direction according to some embodiments of the present disclosure.

Please referring to FIG. 15 along with FIGS. 16-17, FIG. 15 is a partial perspective view illustrating an exemplary semiconductor device 800 according to other embodiments of the present disclosure. FIG. 16 is a top view illustrating a semiconductor device corresponding to FIG. 15 according to some embodiments of the present disclosure, and FIG. 17 is a projection view illustrating partial elements of a semiconductor device shown in FIG. 15 projecting to XY plane along +Z direction according to some embodiments of the present disclosure.

The semiconductor device 800 illustrated in FIG. 15 is substantially similar to the semiconductor structure 100 illustrated in FIG. 1, the difference being that the electric connection structure 172 includes two electric connection structures 1721 and 1722, the first contact 176 includes two first contacts 1761 and 1762, and the second contacts 177a and 177b include two pairs of second contacts 177a1, 177a2, 177b1, and 177b2. Specifically, the electric connection structure 1722 (or another electric connection structure 1722) is disposed in the direction −X of the electric connection structure 1721.

In the embodiment of FIG. 15, one of the ends of the electric connections structures 1721 and 1722 (close to the direction −Y) is electrically connected to the source electrode 132 by the second contacts 177a1 and 177a2, the source metal layer 136, and the source contact 134, while the other end of the electric connections structures 1721 and 1722 (close to the direction +Y) is electrically connected to the drain electrode 142 by the second contacts 177b1 and 177b2, the drain metal layer 146, and the drain contact 144.

In addition, the center regions (or middle region) of both of the electric connection structures 1721 and 1722 are electrically connected to both ends of the conductive layer 174 by the first contacts 1761 and 1762. In the second direction (direction Y), the first contacts 1761 and 1762 completely overlap, thereby providing the same electric potential for the conductive layer 174.

In the present disclosure, the electric connection structures, which are connected in parallel and electrically connected to the conductive layer thereon, may provide multiple electric potential values when the switch is on, and may provide the carriers (such as electrical charges) multiple conductive paths when the switch is off. Therefore, not only the electric field distribution may be optimized, but also the carriers are prevented from accumulating in the films, thereby improving the performance of the device.

Next, referring to FIG. 16, in the embodiment of FIG. 16, the electric connection structures 1721 and 1722 extend in the second direction (direction Y), and the source metal layer 136 and the drain metal layer 146 extend in the first direction (direction X), thereby exhibiting square-shaped. In addition, the conductive layer 174 also extends in the first direction (direction X), and the electric connection structures 1721 and 1722 extending in the second direction (direction Y) form two intersections with the conductive layer 174.

In the embodiment, the source metal layer 136, the conductive layer 174, the drain metal layer 146, and the electric connection structures 1721 and 1722 form the shape of a number "8".

Next, referring to FIG. 17, in FIG. 17, the source contact 134, the drain contact 144, the electric connection structures 1721 and 1722, two first contacts 1761 and 1762, two pairs of the second contacts 177a1, 177a2, 177b1, and 177b2 are projected to the plane formed by the source metal layer 136, the conductive layer 174, and the drain metal layer 146 to highlight the relative relationship of the features. In addition, in order to highlight the relative position of the first contact and the second contact, the electric connection structures 1721 and 1722 are shown in "dash line" and illustrated below the first contact and the second contact.

In this embodiment, the second contacts 177a1 and 177a2 close to the source structure 130, the second contacts 177b1 and 177b2 close to the drain structure 140, and the first contacts 1761 and 1762 are spaced apart from each other. Specifically, two second contacts 177a1 and 177a2 close to the source structure 130 does not directly contact each other, but electrically connect to each other by the source metal layer 136. The first contact 1761, which is electrically connected to the electric connection structure 1721, and the second contacts 177a1 and 177b1 does not directly contact to each other, either.

Figure 18:
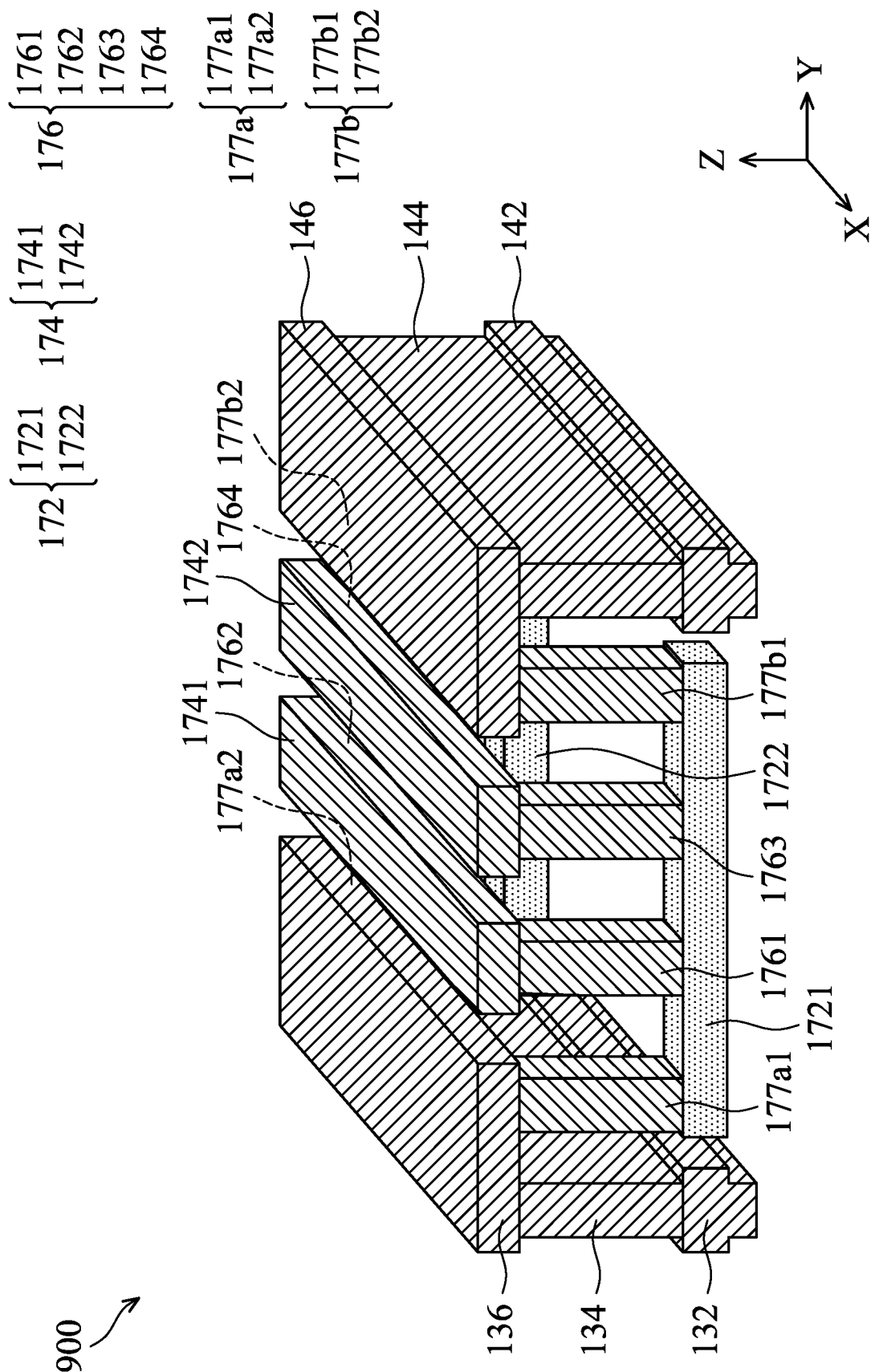
FIG. 18 is a partial perspective view illustrating an exemplary semiconductor device according to other embodiments of the present disclosure.
Figure 19:
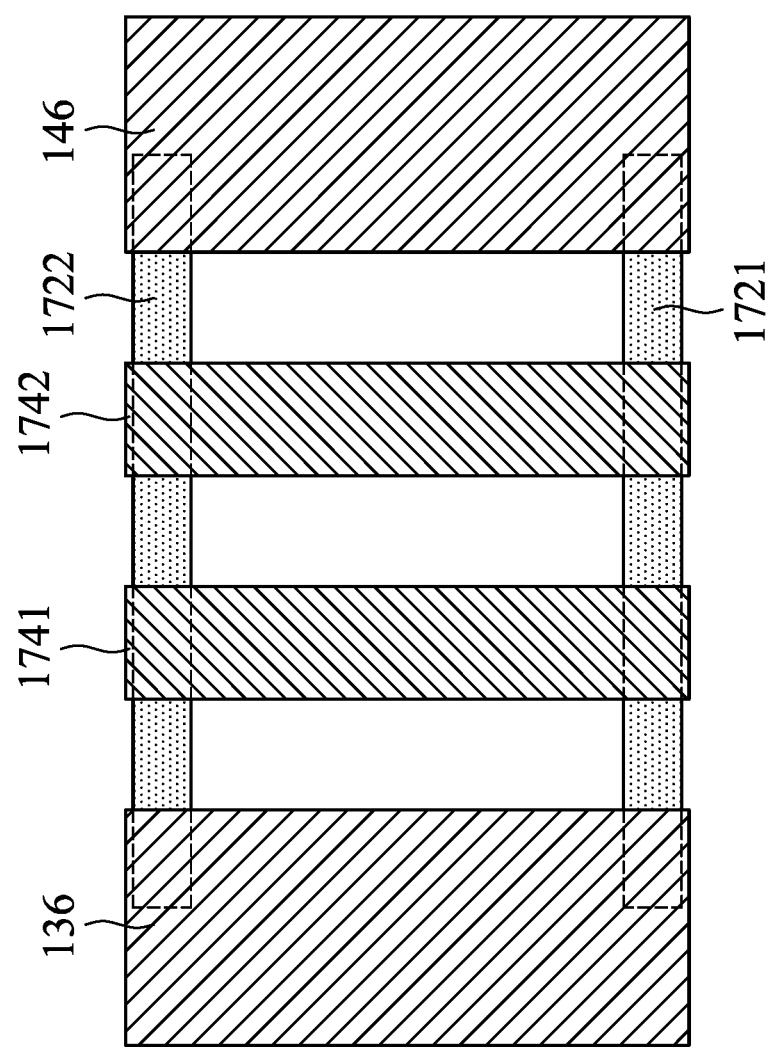
FIG. 19 is a top view illustrating a semiconductor device corresponding to FIG. 18 according to some embodiments of the present disclosure.

Referring to FIG. 18 along with FIG. 19, FIG. 18 is a partial perspective view illustrating an exemplary semiconductor device 900 according to other embodiments of the present disclosure, and FIG. 19 is a top view illustrating a semiconductor device 900 corresponding to FIG. 18 according to some embodiments of the present disclosure.

The semiconductor device 900 illustrated in FIG. 18 is substantially similar to the semiconductor structure 800 illustrated in FIG. 15, the difference being that the conductive layer 174 includes two conductive layers 1741 and 1742, and the first contacts includes four first contacts 1761, 1762, 1763, and 1764. In this embodiment, one conductive layer is corresponding to two first contacts. For example, the conductive layer 1742 is electrically connected to the electric connection structures 1721 and 1722 by the first contacts 1763 and 1764, respectively.

In addition, in the embodiment of FIG. 18, in the second direction (direction Y), the first contacts 1761 and 1763 are not overlapped, and neither are the first contacts 1762 and 1764. Thus, the conductive layers 1741 and 1742 are not overlapped in the second direction. In other words, the conductive layers 1741 and 1742 may have different electric potentials.

With multiple conductive layers, the electric potential of the source structure and that of the drain structure may be divided into multiple electric potentials between the electric potential of the source structure and that of the drain structure. In such way, the electric field distribution of the semiconductor device may be effectively improved to reduce the electric field of the elements (such as the source structure 130 and the gate structure (not shown)) at the side of direction −Y.

Next, referring to FIG. 19, the embodiment of FIG. 19 is substantially similar to the embodiment of FIG. 16, the difference being that two conductive layers 1741 and 1742 extend in the first direction (direction X), and the electric connection structures 1721 and 1722 extending in the second direction (direction Y) form four intersections with the conductive layers 1741 and 1742.

Figure 20:
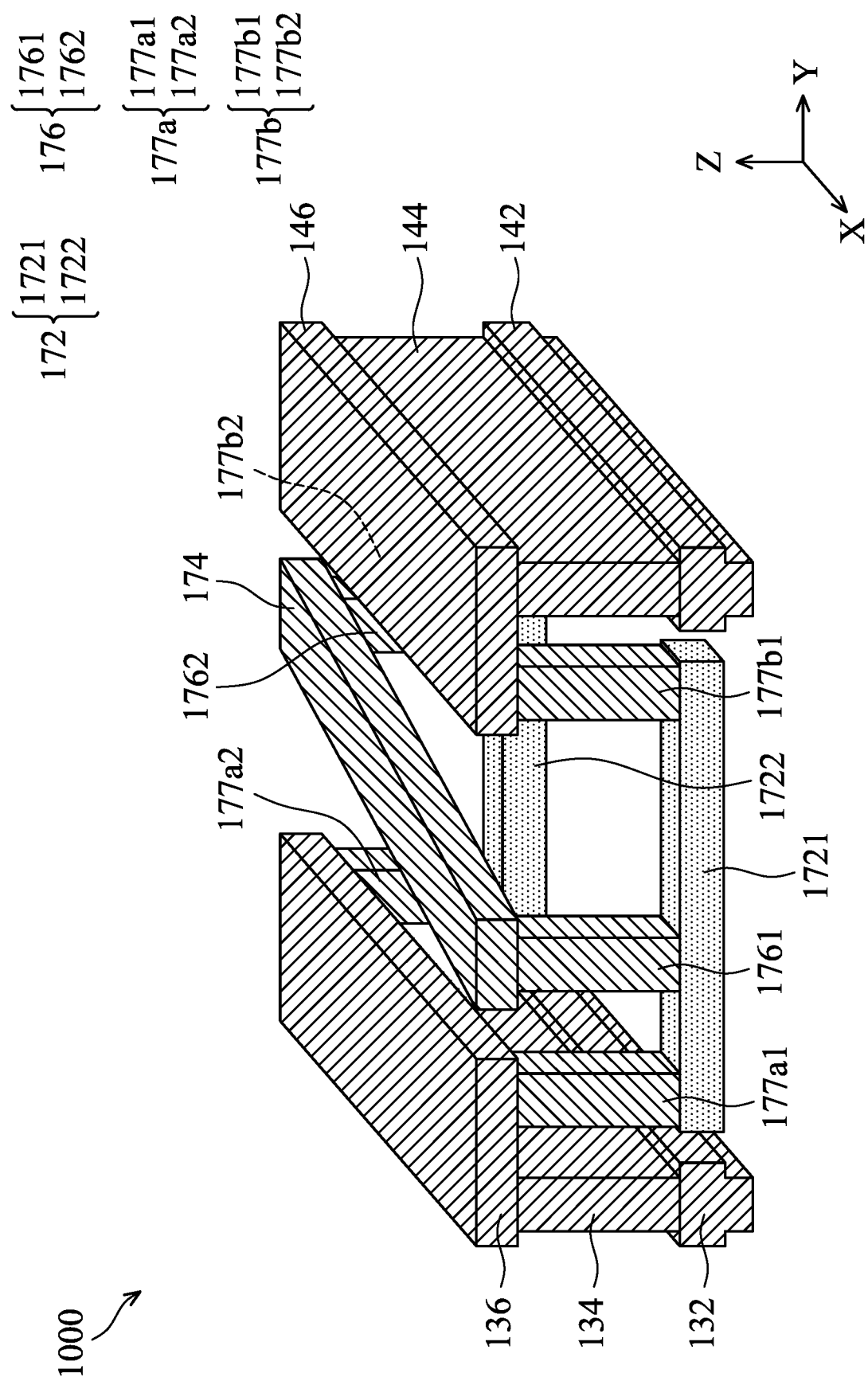
FIG. 20 is a partial perspective view illustrating an exemplary semiconductor device according to other embodiments of the present disclosure.
Figure 21:
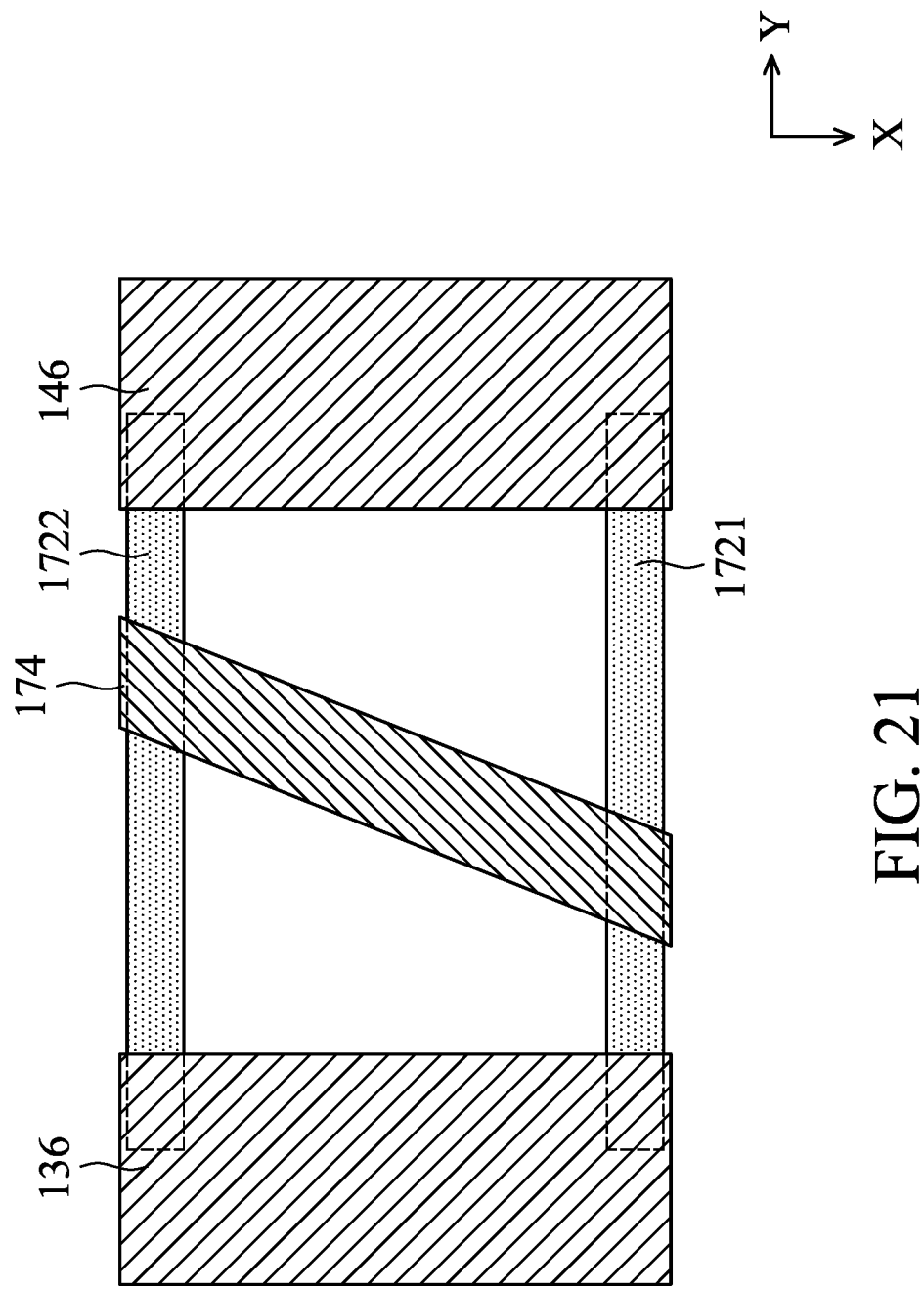
FIG. 21 is a top view illustrating a semiconductor device corresponding to FIG. 20 according to other embodiments of the present disclosure.

Referring to FIG. 20 along with FIG. 21, FIG. 20 is a partial perspective view illustrating an exemplary semiconductor device 1000 according to other embodiments of the present disclosure, and FIG. 21 is a top view illustrating a semiconductor device 1000 corresponding to FIG. 20 according to other embodiments of the present disclosure.

The semiconductor device 1000 illustrated in FIG. 20 is substantially similar to the semiconductor structure 800 illustrated in FIG. 15, the difference being that the conductive layer 174 does not extend in the first direction, but has an angle with the first direction. Specifically, in the second direction (direction Y), the first contacts 1761 and 1762 are not disposed at the same position. In other words, in the second direction (direction Y), they are level with their sidewalls, or have a distance therebetween. Thus, both ends of the conductive layer 174 respectively electrically connected to the first contacts 1761 and 1762 have different electric potential.

Next, referring to FIG. 21, the embodiment of FIG. 21 is substantially similar to the embodiment of FIG. 16, the difference being that the conductive layer 174 does not extend in the first direction (direction X), but extends in a direction having an angle with the first direction. Thus, in the embodiment of FIG. 21, the square shape surrounded by the source metal layer 136, the drain metal layer 146, and the electric connection structures 1721 and 1722 is divided into two trapezoid shape by the conductive layer 174. In such a way, the layout of the electric field modulation structure 170 was more flexibility.

In summary, the electric field modulation structure provided by the present disclosure may generate the electric potential different from the electric potential of the source structure and that of the drain structure, and also modify the electric field distribution and reduce the surface electric field. In addition, when the switch is off, the carriers may be also guided outside the device by the conductive path to reduce the changes of the electrical properties of the device. In other words, the features mentioned above provide by the present disclosure may improve the operable stability and the reliability of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a seed layer on the substrate;
an epitaxial layer on the seed layer;
an electrode structure on the epitaxial layer, wherein the electrode structure comprises a gate structure and a source structure and a drain structure disposed on opposite sides of the gate structure; and
an electric field modulation structure comprising an electric connection structure and a conductive layer electrically connected to the electric connection structure, wherein the conductive layer is disposed between the source structure and the drain structure and above the electric connection structure and the epitaxial layer, and the electric connection structure is electrically connected to the source structure and the drain structure, wherein a lengthwise direction of the source structure is a first direction and a direction from the source structure to the drain structure is a second direction, wherein the first direction is perpendicular to the second direction,
wherein an electric potential of the conductive layer is different from both an electric potential of the source structure and an electric potential of the drain structure.

2. The semiconductor device as claimed in claim 1, wherein an electric potential of the conductive layer is between an electric potential of the source structure and an electric potential of the drain structure.

3. The semiconductor device as claimed in claim 1, wherein the electric field modulation structure extends in the second direction and the conductive layer extends in the first direction.

4. The semiconductor device as claimed in claim 1, wherein the electric field modulation structure further comprises a contact electrically connected to the electric connection structure and the conductive layer.

5. The semiconductor device as claimed in claim 1, wherein the electric field modulation structure further comprises a pair of contacts, one of the contacts electrically connected to the electric connection structure and the source structure, and the other one of the contacts electrically connected to the electric connection structure and the drain structure.

6. The semiconductor device as claimed in claim 1, wherein the electric connection structure is a two-dimensional electron gas (2DEG) in the epitaxial layer.

7. The semiconductor device as claimed in claim 1, wherein the gate structure and the drain structure define an access region, wherein the electric connection structure is disposed outside the access region and the conductive layer spans over the access region.

8. The semiconductor device as claimed in claim 1, wherein a length of the electric connection structure is greater than a distance between a source electrode of the source structure and a drain electrode of the drain structure.

9. The semiconductor device as claimed in claim 1, wherein the electric connection structure is in direct contact with the epitaxial layer.

10. The semiconductor device as claimed in claim 1, wherein the electric connection structure is spaced apart from the epitaxial layer by a dielectric layer.

11. The semiconductor device as claimed in claim 1, wherein a source electrode of the source structure is electrically connected to the electric connection structure by a source metal layer and a drain electrode of the drain structure is electrically connected to the electric connection structure by a drain metal layer.

12. The semiconductor device as claimed in claim 1, wherein the electric connection structure and the source structure overlap in the first direction.

13. The semiconductor device as claimed in claim 1, wherein the source structure completely covers the gate structure.

14. The semiconductor device as claimed in claim 1, wherein the electric field modulation structure further comprises an another electric connection structure electrically connected to the conductive layer.

15. The semiconductor device as claimed in claim 14, wherein both ends of the conductive layer electrically connected to the electric connection structures have a same electric potential.

16. The semiconductor device as claimed in claim 14, wherein both ends of the electric connection structure and the another electric connection structure are electrically connected to the source structure and the drain structure.

17. The semiconductor device as claimed in claim 14, wherein the electric field modulation structure further comprises an another conductive layer electrically connected to the electric connection structures.

18. The semiconductor device as claimed in claim 1, wherein the electric connection structure comprises a material of metal or semiconductor.

19. The semiconductor device as claimed in claim 1, wherein a resistivity of the electric connection structure is between $10^6\Omega$ and $10^8\Omega$.

* * * * *